United States Patent
Zhu et al.

(10) Patent No.: US 10,361,697 B2
(45) Date of Patent: Jul. 23, 2019

(54) SWITCH LINEARIZATION BY COMPENSATION OF A FIELD-EFFECT TRANSISTOR

(71) Applicant: SKYWORKS SOLUTIONS, INC., Woburn, MA (US)

(72) Inventors: Yu Zhu, Wellesley, MA (US); Hanching Fuh, Allston, MA (US); Oleksiy Klimashov, Burlington, MA (US); Dylan Charles Bartle, Arlington, MA (US); Paul T. DiCarlo, Marlborough, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/851,810

(22) Filed: Dec. 22, 2017

(65) Prior Publication Data

US 2018/0183431 A1 Jun. 28, 2018

Related U.S. Application Data

(60) Provisional application No. 62/438,773, filed on Dec. 23, 2016.

(51) Int. Cl.
| | |
|---|---|
| *H04B 1/48* | (2006.01) |
| *H03K 17/16* | (2006.01) |
| *H01L 27/12* | (2006.01) |
| *H03K 17/693* | (2006.01) |
| *H04B 1/04* | (2006.01) |

(52) U.S. Cl.
CPC ....... *H03K 17/162* (2013.01); *H01L 27/1203* (2013.01); *H03K 17/693* (2013.01); *H04B 1/48* (2013.01); *H03K 17/161* (2013.01); *H04B 2001/0408* (2013.01)

(58) Field of Classification Search
CPC .... H03K 17/162; H01L 27/1203; H04B 1/48; H04B 2001/0408
USPC .......................................... 455/82; 327/379
See application file for complete search history.

(56) References Cited

U.S. PATENT DOCUMENTS

| | | | | |
|---|---|---|---|---|
| 4,443,810 A | * | 4/1984 | Yatsuo | H01L 29/744 257/149 |
| 5,748,053 A | * | 5/1998 | Kameyama | H03K 17/693 327/404 |
| 5,969,560 A | * | 10/1999 | Kohama | H03K 17/687 327/308 |

(Continued)

*Primary Examiner* — Hai V Nguyen
(74) *Attorney, Agent, or Firm* — Chang & Hale LLP

(57) ABSTRACT

Disclosed herein are systems and methods for reducing intermodulation distortion (IMD) in switches using parallel distorter circuits. A switch circuit can include having a switch arm and a distorter arm that is configured to act as a compensation circuit to compensate for non-linearities in the switch arm. The switch circuit can include a plurality of FETs in the switch arm configured to provide switching functionality. The distorter arm is configured to compensate for a non-linearity effect generated by the FETs of the switch arm when it is in an ON state. The distorter arm is configured to compensate for the non-linearity effect generated by the switch arm independent of the frequency of the signal received by the switch arm. Various configurations of switch arms and distorter arms can be implemented to reduce harmonic distortion as well as intermodulation distortion.

19 Claims, 20 Drawing Sheets

(56) References Cited

U.S. PATENT DOCUMENTS

| | | | | |
|---|---|---|---|---|
| 6,094,088 | A * | 7/2000 | Yano | H03K 17/693 327/534 |
| 6,222,329 | B1 * | 4/2001 | Kikuchi | H04N 3/237 315/399 |
| 7,283,347 | B2 * | 10/2007 | Reid, Jr. | H01G 5/18 257/E21.011 |
| 7,348,847 | B2 * | 3/2008 | Whittaker | H03F 1/0211 330/250 |
| 7,436,237 | B2 * | 10/2008 | Hikita | H03K 17/063 327/379 |
| 7,456,638 | B2 * | 11/2008 | Bhansali | G01C 13/008 324/446 |
| 7,787,831 | B2 * | 8/2010 | Uejima | H04B 1/48 257/275 |
| 7,977,137 | B1 * | 7/2011 | Ebel | B81B 7/0064 200/181 |
| 8,081,928 | B2 * | 12/2011 | Kelly | H03K 17/6871 333/101 |
| 8,349,635 | B1 * | 1/2013 | Gan | G01L 9/0019 257/E23.18 |
| 8,723,260 | B1 * | 5/2014 | Carroll | H01L 21/84 257/347 |
| 8,975,947 | B1 * | 3/2015 | Seshita | H03K 17/162 327/379 |
| 8,975,950 | B2 * | 3/2015 | Madan | H03K 17/162 327/434 |
| 9,160,328 | B2 * | 10/2015 | Altunkilic | H03K 17/161 |
| 9,337,823 | B2 * | 5/2016 | Li | H03K 17/161 |
| 9,425,782 | B2 * | 8/2016 | Jeong | H03K 17/063 |
| 9,450,579 | B2 * | 9/2016 | Madan | H04B 1/44 |
| 9,503,074 | B2 * | 11/2016 | Aubain | H03K 17/162 |
| 9,595,951 | B2 * | 3/2017 | Sprinkle | H03K 17/161 |
| 9,628,075 | B2 * | 4/2017 | Cebi | H03K 17/687 |
| 9,685,943 | B2 * | 6/2017 | Madan | H03K 17/162 |
| 9,712,117 | B2 * | 7/2017 | Searle | H03F 1/0277 |
| 9,899,960 | B2 * | 2/2018 | Searle | H03F 1/0277 |
| 9,935,627 | B2 * | 4/2018 | Cebi | H03K 17/161 |
| 9,941,347 | B2 * | 4/2018 | Shapiro | H01L 27/027 |
| 2003/0020173 | A1 * | 1/2003 | Huff | B81B 7/0064 257/774 |
| 2003/0230798 | A1 * | 12/2003 | Lin | B81B 7/0064 257/704 |
| 2004/0009649 | A1 * | 1/2004 | Kub | B82Y 30/00 438/459 |
| 2005/0264341 | A1 * | 12/2005 | Hikita | H03K 17/063 327/427 |
| 2006/0194558 | A1 * | 8/2006 | Kelly | H03K 17/6871 455/319 |
| 2006/0244534 | A1 * | 11/2006 | Whittaker | H03F 1/0211 330/285 |
| 2011/0294444 | A1 * | 12/2011 | Kawano | H01L 27/0605 455/83 |
| 2012/0153438 | A1 * | 6/2012 | Harrison | H01L 29/16 257/610 |
| 2012/0175715 | A1 * | 7/2012 | Hammond | H01H 1/0036 257/415 |
| 2013/0236881 | A1 * | 9/2013 | Spatz | B81C 1/00031 435/5 |
| 2014/0009205 | A1 * | 1/2014 | Madan | H03K 17/162 327/379 |
| 2014/0009214 | A1 * | 1/2014 | Altunkilic | H03K 17/161 327/427 |
| 2014/0231875 | A1 * | 8/2014 | Takatani | H01L 27/0266 257/195 |
| 2015/0041917 | A1 * | 2/2015 | Zhu | H01L 27/0207 257/392 |
| 2015/0147981 | A1 * | 5/2015 | Madan | H03K 17/162 455/83 |
| 2015/0171108 | A1 * | 6/2015 | Blin | H01L 27/1203 257/347 |
| 2015/0365088 | A1 * | 12/2015 | Madan | H04B 1/44 455/83 |
| 2015/0372590 | A1 * | 12/2015 | Seshita | H03K 5/08 327/536 |
| 2015/0381171 | A1 * | 12/2015 | Cebi | H03K 17/687 327/427 |
| 2016/0134281 | A1 * | 5/2016 | Cebi | H03K 17/687 327/436 |
| 2016/0190996 | A1 * | 6/2016 | Searle | H03F 1/0277 330/295 |
| 2016/0372606 | A1 * | 12/2016 | Ito | H01L 29/78693 |
| 2017/0077877 | A1 * | 3/2017 | Anderson | B82Y 10/00 |
| 2017/0111065 | A1 * | 4/2017 | Cook | H04B 1/0475 |
| 2017/0187375 | A1 * | 6/2017 | Madan | H01L 23/66 |
| 2017/0264251 | A1 * | 9/2017 | Cook | H03F 3/245 |
| 2017/0331434 | A1 * | 11/2017 | Searle | H03F 1/0277 |
| 2017/0346482 | A1 * | 11/2017 | Cebi | H03K 17/161 |
| 2018/0048305 | A1 * | 2/2018 | Jin | H01L 23/66 |
| 2018/0091132 | A1 * | 3/2018 | Wang | H01L 23/66 |
| 2018/0091136 | A1 * | 3/2018 | Wang | H01L 23/66 |
| 2018/0108988 | A1 * | 4/2018 | Liu | H03K 17/145 |
| 2018/0145678 | A1 * | 5/2018 | Maxim | H03K 17/063 |

* cited by examiner

SWITCH LINEARIZATION BY COMPENSATION OF A FIELD-EFFECT TRANSISTOR

CROSS-REFERENCE TO RELATED APPLICATIONS

This application claims priority to U.S. Provisional Application No. 62/438,773 filed Dec. 23, 2016 and entitled "SWITCH LINEARIZATION BY COMPENSATION OF A FIELD-EFFECT TRANSISTOR," which is expressly incorporated by reference herein in its entirety for all purposes.

This application is also related to U.S. Pat. Pub. No. 2014/0009214, filed Jul. 6, 2013 and published Jan. 9, 2014, entitled "Circuits, devices, methods and applications related to silicon-on-insulator based radio-frequency switches," which is expressly incorporated by reference herein in its entirety for all purposes.

BACKGROUND

Field

The present disclosure generally relates to the field of electronics, and more particularly, to radio-frequency switches.

Description of Related Art

Radio-frequency (RF) switches, such as transistor switches, can be used to switch signals between one or more poles and one or more throws. Transistor switches, or portions thereof, can be controlled through transistor biasing and/or coupling. Design and use of bias and/or coupling circuits in connection with RF switches can affect switching performance.

SUMMARY

According to a number of implementations, the present disclosure relates to a radio-frequency switch that includes a switch arm having a set of field-effect transistors disposed between a first node and a second node, each field-effect transistor of the set of field-effect transistors having a respective source, drain, gate, and body; and a distorter arm coupled in parallel to the switch arm, the distorter arm having a non-linear resistor or a field-effect transistor, the distorter arm configured to compensate a non-linearity effect generated by the set of field-effect transistors in the switch arm.

In some embodiments, the one or more field-effect transistors of the distorter arm have a gate width that is smaller than about 10 μm and the set of field-effect transistors of the switch arm have a gate width that is larger than about 1 mm. In some embodiments, the set of field-effect transistors of the switch arm includes at least 12 field-effect transistors.

In some embodiments, the radio-frequency switch further includes a voltage buffer coupled in series with the distorter arm and in parallel with the switch arm, the voltage buffer including a set of field-effect transistors. In further embodiments, the set of field-effect transistors of the voltage buffer each have a gate width that is larger than a gate width of the field-effect transistor of the distorter arm and smaller than a gate width of each field-effect transistor in the switch arm. In further embodiments, in an ON state of the radio-frequency switch, the voltage buffer, the switch arm, and the distorter arm are configured to be in an ON state. In yet further embodiments, in an OFF state of the radio-frequency switch, the voltage buffer and the switch arm are configured to be in an OFF state and the distorter arm is configured to be in an ON state.

In some embodiments, the radio-frequency switch further includes a second distorter arm coupled in parallel to the switch arm and to the distorter arm, the second distorter arm having a non-linear resistor or a field-effect transistor. In further embodiments, the radio-frequency switch further includes a voltage supply configured to provide a first drain-source voltage on the field-effect transistor of the distorter arm and to provide a second drain-source voltage on the field-effect transistor of the second distorter arm, wherein the first drain-source voltage and the second drain-source voltage have the same magnitude and opposite polarity. In further embodiments, the radio-frequency switch further includes a first DC-blocking capacitor having a first end coupled to a junction between the first node and the switch arm and a second end coupled to the distorter arm and a second DC-blocking capacitor having a first end coupled to a junction between the second node and the switch arm and a second end coupled to the distorter arm. In further embodiments, the distorter arm and the second distorter arm are each configured to compensate the non-linearity effect by generating third-order intermodulation distortion and the distorter arm and the second distorter arm do not increase second-order harmonic distortion of the radio-frequency switch. In further embodiments, the radio frequency switch further includes a biasing circuit having at least two current sources to drive currents to the distorter arm and to the second distorter arm. In yet further embodiments, the at least two current sources generate a current loop in the biasing circuit, the current loop being formed with the distorter arm, the second distorter arm, and the at least two current sources. In yet further embodiments, due at least in part to high impedance of the at least two current sources, the biasing circuit reduces RF choke between a DC bias source and the distorter arm and the second distorter arm.

In some embodiments, the distorter arm is configured to generate third-order intermodulation distortion to reduce the non-linearity effect generated by the set of field-effect transistors in the switch arm. In some embodiments, the set of field-effect transistors comprise silicon-on-insulator (SOI) set of field-effect transistors.

According to a number of implementations, the present disclosure relates to a radio-frequency switch module that includes a packaging substrate configured to receive a plurality of components and a semiconductor die mounted on the packaging substrate, the semiconductor die including a set of field-effect transistors in a switch arm. The module also includes a distorter arm mounted on the packaging substrate coupled in parallel with the set of field-effect transistors of the switch arm, the distorter arm having one or more field-effect transistors that are configured to compensate a non-linearity effect generated by the set of field-effect transistors of the switch arm.

In some embodiments, the radio-frequency switch module further includes a voltage buffer mounted on the packaging substrate, the voltage buffer coupled in series with the distorter arm and combination of the distorter arm and the voltage buffer coupled in parallel with the switch arm.

According to a number of implementations, the present disclosure relates to a wireless device that includes a transceiver configured to process radio-frequency (RF) signals, an antenna in communication with the transceiver configured to facilitate transmission of an amplified RF signal, and a power amplifier connected to the transceiver and configured to generate the amplified RF signal. The wireless device also includes a switch connected to the antenna and the power amplifier and configured to selectively route the amplified RF signal to the antenna, the switch including a set of field-effect transistors in a switch arm, and a distorter arm coupled in parallel with the set of field-effect transistors of the switch arm, the distorter arm having one or more field-effect transistors that are configured to compensate a non-linearity effect generated by the set of field-effect transistors of the switch arm.

In some embodiments, the switch further includes a second distorter coupled in parallel with the set of field-effect transistors of the switch arm, the second distorter arm having one or more field-effect transistors, the combination of the distorter arm and the second distorter arm configured to compensate a non-linearity effect generated by the set of field-effect transistors of the switch arm.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Example Components of a Switching Device

Figure 1:
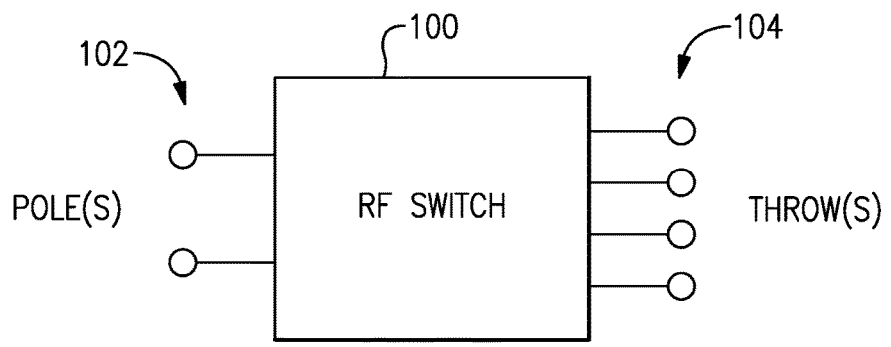
FIG. 1 illustrates a schematic representation of a radio-frequency (RF) switch configured to switch one or more signals between one or more poles and one or more throws.

FIG. 1 schematically shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state. The switch 100 can include coupling circuits, such as parallel distorter circuits disclosed herein, that are configured to improve performance of the switch. For example, parallel distorter circuits disclosed herein can generate signals that reduce or eliminate non-linearities in the switch 100.

Figure 2:
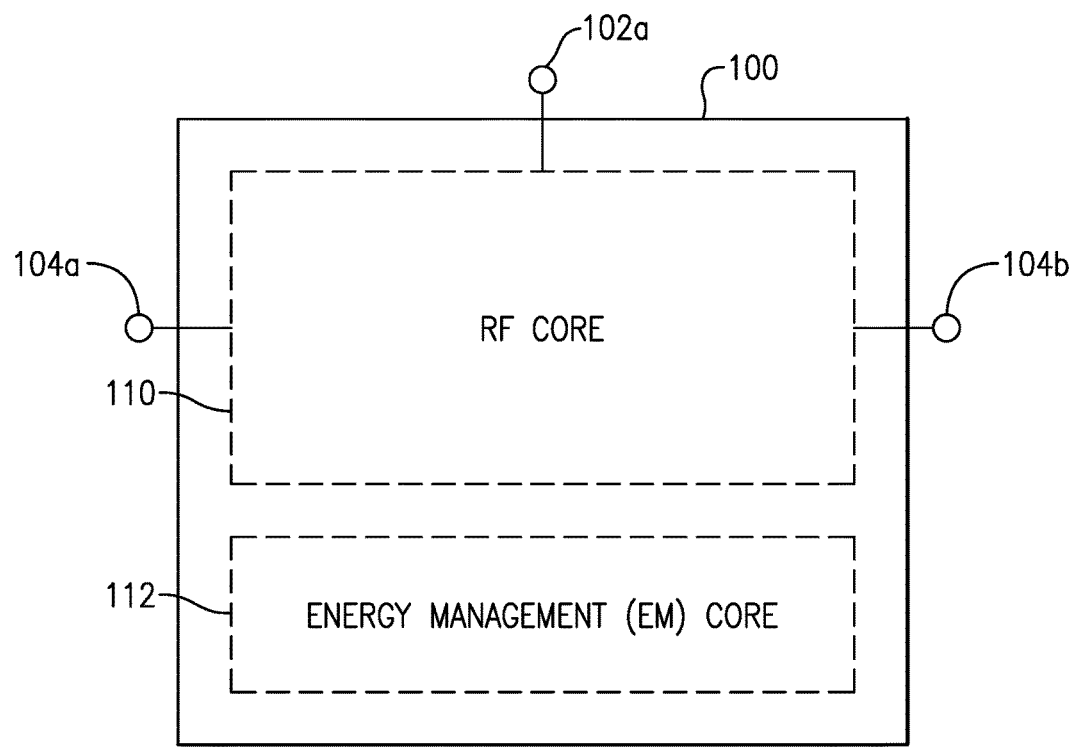
FIG. 2 illustrates that, in some implementations, the RF switch of FIG. 1 can include an RF core and an energy management (EM) core.

FIG. 2 shows that in some implementations, the RF switch 100 of FIG. 1 can include an RF core 110 and an energy management (EM) core 112. The RF core 110 can be configured to route RF signals between the first and second ports. In the example single-pole-double-throw (SPDT) configuration shown in FIG. 2, such first and second ports can include a pole 102a and a first throw 104a, or the pole 102a and a second throw 104b.

In some embodiments, EM core 112 can be configured to supply, for example, voltage control signals to the RF core. The EM core 112 can be further configured to provide the RF switch 100 with logic decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 2.

Figure 3:
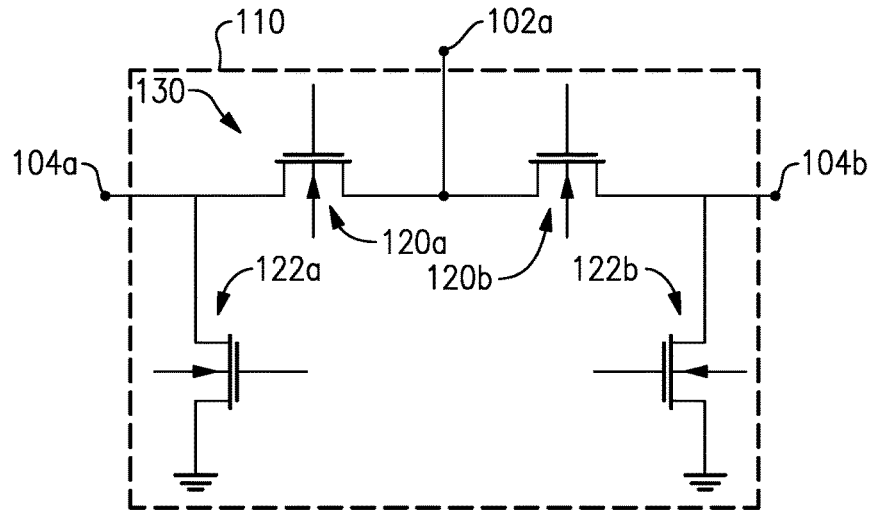
FIG. 3 illustrates an example configuration of an RF core for the RF switch of FIG. 1.

In the example SPDT context, FIG. 3 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via FET 122a to provide shunting capability for the node 104a. Similarly, the second throw node 104b is shown to be coupled to the RF ground via FET 122b to provide shunting capability for the node 104b.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one pole, and the number of throws can be less than or greater than the example number of two.

In the example of FIG. 3, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs.

Figure 4:
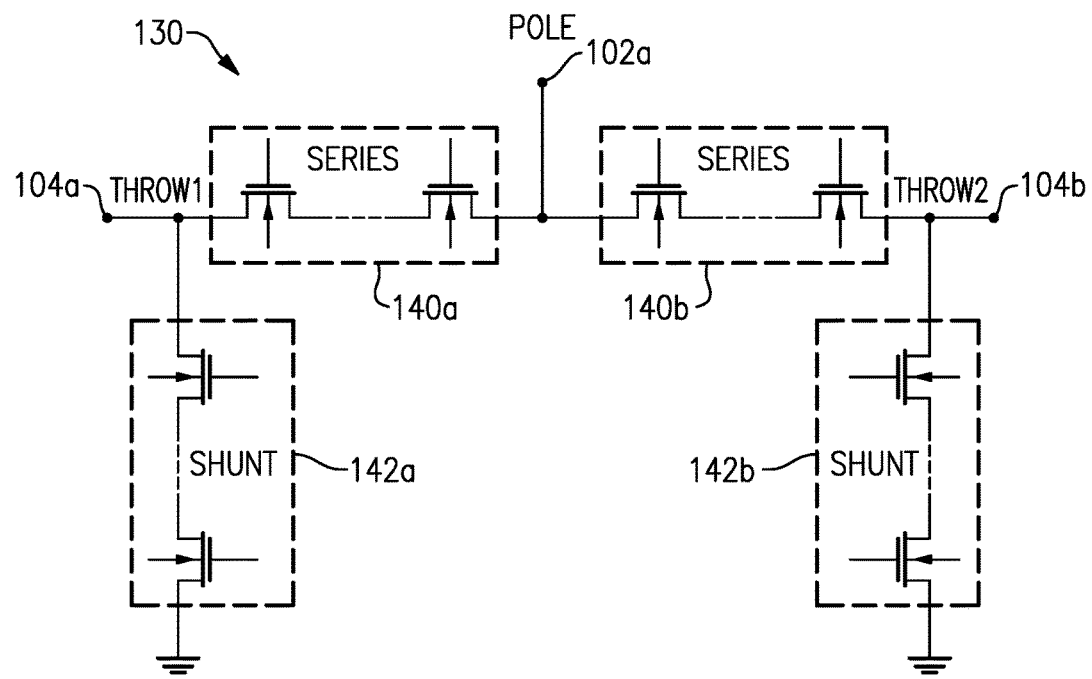
FIG. 4 illustrates an example RF core configuration having switch arm segments and shunt arm segments.

An example RF core configuration 130 of an RF core having such switch arm segments is shown in FIG. 4. In the example, the pole 102a and the first throw node 104a are shown to be coupled via a first switch arm segment 140a. Similarly, the pole 102a and the second throw node 104b are shown to be coupled via a second switch arm segment 140b. The first throw node 104a is shown to be capable of being shunted to an RF ground via a first shunt arm segment 142a. Similarly, the second throw node 104b is shown to be capable of being shunted to the RF ground via a second shunt arm segment 142b.

In an example operation, when the RF core 130 is in a state where an RF signal is being passed between the pole 102a and the first throw node 104a, all of the FETs in the first switch arm segment 140a can be in an ON state, and all of the FETs in the second switch arm segment 104b can be in an OFF state. The first shunt arm 142a for the first throw node 104a can have all of its FETs in an OFF state so that the RF signal is not shunted to ground as it travels from the pole 102a to the first throw node 104a. All of the FETs in the second shunt arm 142b associated with the second throw node 104b can be in an ON state so that any RF signals or noise arriving at the RF core 130 through the second throw node 104b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 140a, 140b, 142a, 142b) can include one or more semiconductor transistors such as FETs. In some embodiments, an FET may be capable of being in a first state or a second state and can include a gate, a drain, a source, and a body (sometimes also referred to as a substrate). In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state). A series of coupled FETs can be referred to as a stack, a stack of FETs, or a FET stack.

Figure 5:
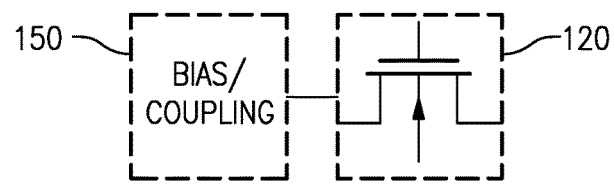
FIG. 5 illustrates that, in some implementations, control of an FET can be facilitated by a circuit configured to bias and/or couple one or more portions of the FET.

At least some of the present disclosure relates to how an FET or a group of FETs can be controlled to provide switching functionalities in desirable manners. FIG. 5 schematically shows that in some implementations, such controlling of an FET 120 can be facilitated by a circuit 150 configured to bias and/or couple one or more portions of the FET 120. In some embodiments, such a circuit 150 can include one or more circuits configured to bias and/or couple a gate of the FET 120, bias and/or couple a body of the FET 120, and/or couple a source/drain of the FET 120.

Figure 6:
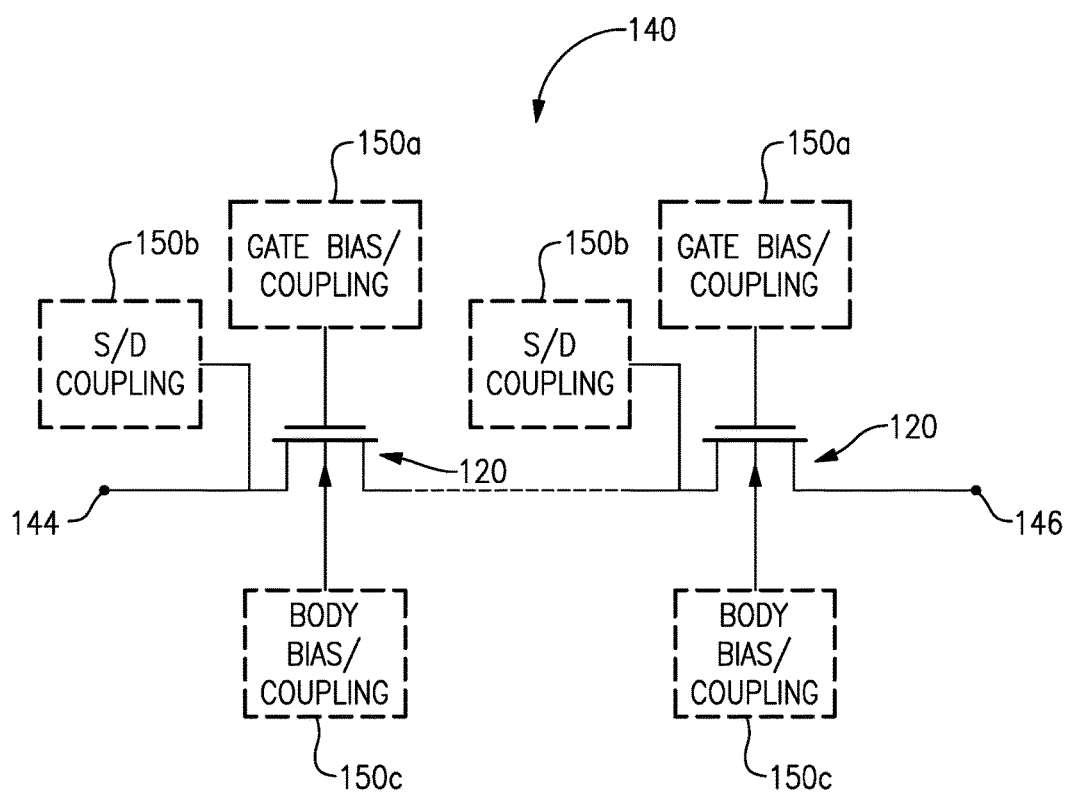
FIG. 6 illustrates an example configuration of a portion of a switch to illustrate biasing and/or coupling of different parts of one or more FETs.

Schematic examples of how such biasing and/or coupling of different parts of one or more FETs are described in reference to FIG. 6. In FIG. 6, a switch arm segment 140 (that can be, for example, one of the example switch arm segments 140a, 140b, 142a, 142b of the example of FIG. 4) between nodes 144, 146 is shown to include a plurality of FETs 120. Operations of such FETs can be controlled and/or facilitated by a gate bias/coupling circuit 150a, a body bias/coupling circuit 150c, and/or a source/drain coupling circuit 150b.

Gate Bias/Coupling Circuit

In the example shown in FIG. 6, the gate of each of the FETs 120 can be connected to the gate bias/coupling circuit 150a to receive a gate bias signal and/or couple the gate to another part of the FET 120 or the switch arm 140. In some implementations, designs or features of the gate bias/coupling circuit 150a can improve performance of the switch arm 140. Such improvements in performance can include, but are not limited to, device insertion loss, isolation performance, power handling capability, and/or switching device linearity. Example gate bias/coupling circuits are discussed in more detail in U.S. Pat. Pub. No. 2014/0009214, filed Jul. 6, 2013 and published Jan. 9, 2014, entitled "Circuits, devices, methods and applications related to silicon-on-insulator based radio-frequency switches," which is expressly incorporated by reference herein in its entirety.

Body Bias/Coupling Circuit

As shown in FIG. 6, the body of each FET 120 can be connected to the body bias/coupling circuit 150c to receive a body bias signal and/or couple the body to another part of the FET 120 or the switch arm 140. In some implementations, designs or features of the body bias/coupling circuit 150c can improve performance of the switch arm 140. Such improvements in performance can include, but are not limited to, device insertion loss, isolation performance, power handling capability, and/or switching device linearity. Example body bias/coupling circuits are discussed in more detail in U.S. Pat. Pub. No. 2014/0009214, filed Jul. 6, 2013 and published Jan. 9, 2014, entitled "Circuits, devices, methods and applications related to silicon-on-insulator based radio-frequency switches," which is expressly incorporated by reference herein in its entirety.

Source/Drain Coupling Circuit

As shown in FIG. 6, the source/drain of each FET 120 can be connected to the coupling circuit 150b to couple the source/drain to another part of the FET 120 or the switch arm 140. In some implementations, designs or features of the coupling circuit 150b can improve performance of the switch arm 140. Such improvements in performance can include, but are not limited to, device insertion loss, isolation performance, power handling capability, and/or switching device linearity. Example coupling circuits are discussed in more detail in U.S. Pat. Pub. No. 2014/0009214, filed Jul. 6, 2013 and published Jan. 9, 2014, entitled "Circuits, devices, methods and applications related to silicon-on-insulator based radio-frequency switches," which is expressly incorporated by reference herein in its entirety.

Examples of Switching Performance Parameters

Insertion Loss

A switching device performance parameter can include a measure of insertion loss. A switching device insertion loss can be a measure of the attenuation of an RF signal that is routed through the RF switching device. For example, the magnitude of an RF signal at an output port of a switching device can be less than the magnitude of the RF signal at an input port of the switching device. In some embodiments, a switching device can include device components that introduce parasitic capacitance, inductance, resistance, or conductance into the device, contributing to increased switching device insertion loss. In some embodiments, a switching device insertion loss can be measured as a ratio of the power or voltage of an RF signal at an input port to the power or voltage of the RF signal at an output port of the switching device. Decreased switching device insertion loss can be desirable to enable improved RF signal transmission.

Isolation

A switching device performance parameter can also include a measure of isolation. Switching device isolation can be a measure of the RF isolation between an input port and an output port an RF switching device. In some embodiments, it can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Intermodulation Distortion

A switching device performance parameter can further include a measure of intermodulation distortion (IMD) performance. Intermodulation distortion (IMD) can be a measure of non-linearity in an RF switching device.

IMD can result from two or more signals mixing together and yielding frequencies that are not harmonic frequencies. For example, suppose that two signals have fundamental frequencies f1 and f2 (f2>f1) that are relatively close to each other in frequency space. Mixing of such signals can result in peaks in frequency spectrum at frequencies corresponding to different products of fundamental and harmonic frequencies of the two signals. For example, a second-order intermodulation distortion (also referred to as IMD2) is typically considered to include frequencies f1+f2 f2−f1, 2f1, and 2f2. A third-order IMD (also referred to as IMD3) is typically considered to include 2f1+f2, 2f1−f2, f1+2f2, f1−2f2. Higher order products can be formed in similar manners.

In general, as the IMD order number increases, power levels decrease. Accordingly, second and third orders can be undesirable effects that are of particular interest. Higher orders such as fourth and fifth orders can also be of interest in some situations.

In some RF applications, it can be desirable to reduce susceptibility to interference within an RF system. Non-linearity in RF systems can result in introduction of spurious signals into the system. Spurious signals in the RF system can result in interference within the system and degrade the information transmitted by RF signals. An RF system having increased non-linearity can demonstrate increased susceptibility to interference. Non-linearity in system components, for example switching devices, can contribute to the introduction of spurious signals into the RF system, thereby contributing to degradation of overall RF system linearity and IMD performance.

In some embodiments, RF switching devices can be implemented as part of an RF system including a wireless communication system. IMD performance of the system can be improved by increasing linearity of system components, such as linearity of an RF switching device. In some embodiments, a wireless communication system can operate in a multi-band and/or multi-mode environment. Improvement in intermodulation distortion (IMD) performance can be desirable in wireless communication systems operating in a multi-band and/or multi-mode environment. In some embodiments, improvement of a switching device IMD performance can improve the IMD performance of a wireless communication system operating in a multi-mode and/or multi-band environment.

Improved switching device IMD performance can be desirable for wireless communication devices operating in various wireless communication standards, for example for wireless communication devices operating in the LTE communication standard. In some RF applications, it can be desirable to improve linearity of switching devices operating in wireless communication devices that enable simultaneous transmission of data and voice communication. For example, improved IMD performance in switching devices can be desirable for wireless communication devices operating in the LTE communication standard and performing simultaneous transmission of voice and data communication (e.g., SVLTE).

High Power Handling Capability

In some RF applications, it can be desirable for RF switching devices to operate under high power while reducing degradation of other device performance parameters. In some embodiments, it can be desirable for RF switching devices to operate under high power with improved intermodulation distortion, insertion loss, and/or isolation performance.

In some embodiments, an increased number of transistors can be implemented in a switch arm segment of a switching device to enable improved power handling capability of the switching device. For example, a switch arm segment can include an increased number of FETs connected in series, an increased FET stack height, to enable improved device performance under high power. However, in some embodiments, increased FET stack height can degrade the switching device insertion loss performance.

Examples of FET Structures and Fabrication Process Technologies

A switching device can be implemented on-die, off-die, or some combination thereon. A switching device can also be fabricated using various technologies. In some embodiments, RF switching devices can be fabricated with silicon or silicon-on-insulator (SOI) technology.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate related RF losses. Electrically isolated SOI transistors can facilitate stacking, contributing to decreased chip size.

Figure 7A:
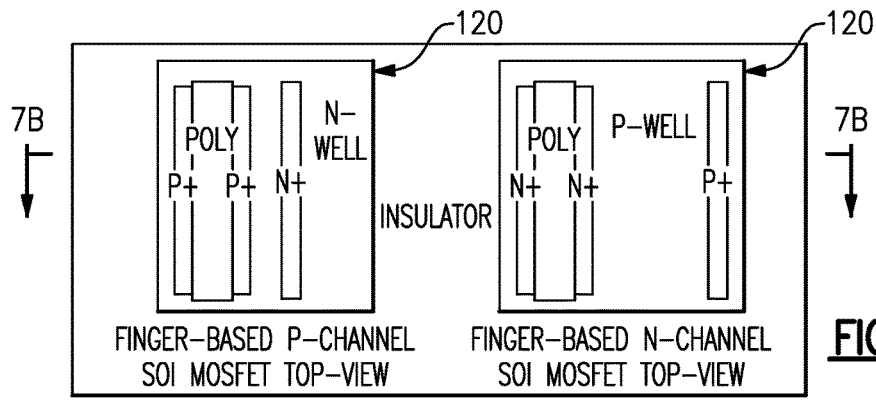
FIGS. 7A and 7B illustrate plan and side sectional views of an example finger-based FET device implemented on silicon-on-insulator (SOI).
Figure 7B:
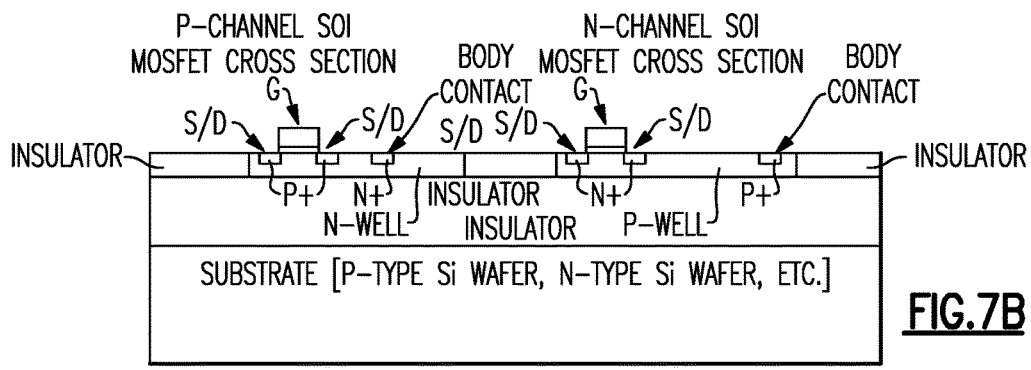

In some SOI FET configurations, each transistor can be configured as a finger-based device where the source and drain are rectangular shaped (in a plan view) and a gate structure extends between the source and drain like a rectangular shaped finger. FIGS. 7A and 7B show plan and side sectional views of an example finger-based FET device implemented on SOI. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 7A and 7B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source (S) and drain (D) are shown to be p-doped regions whose exposed surfaces generally define rectangles. As shown, S/D regions can be configured so that source and drain functionalities are reversed.

FIGS. 7A and 7B further show that a gate (G) can be formed on the n-well so as to be positioned between the source and the drain. The example gate is depicted as having a rectangular shape that extends along with the source and the drain. Also shown is an n-type body contact. Formations of the rectangular shaped well, source and drain regions, and the body contact can be achieved by a number of known techniques. In some embodiments, the source and drain regions can be formed adjacent to the ends of their respective upper insulator layers, and the junctions between the body and the source/drain regions on the opposing sides of the body can extend substantially all the way down to the top of the buried insulator layer. Such a configuration can provide, for example, reduced source/drain junction capacitance. To form a body contact for such a configuration, an additional gate region can be provided on the side so as to allow, for example, an isolated P+ region to contact the Pwell.

Figure 8A:
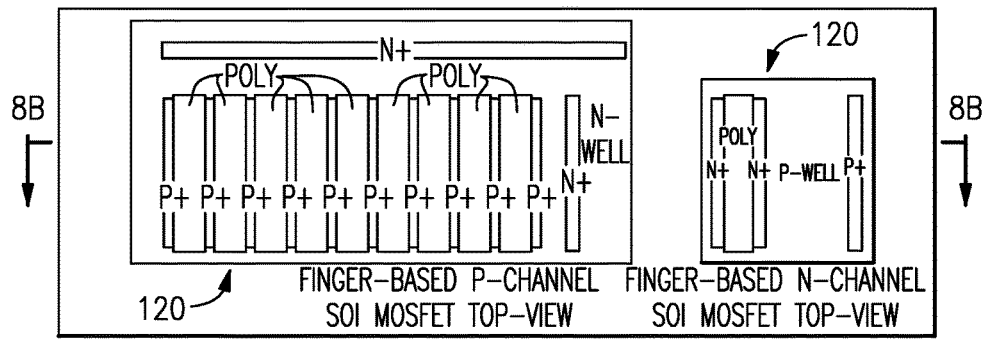
FIGS. 8A and 8B illustrate plan and side sectional views of an example multiple-finger FET device implemented on SOI.
Figure 8B:
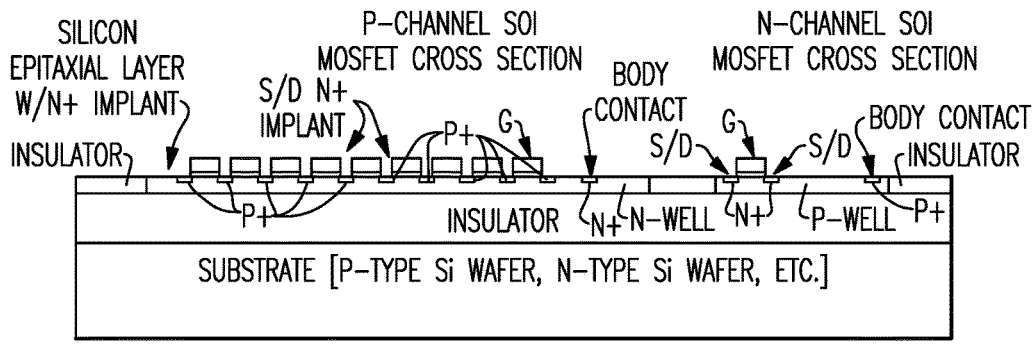

FIGS. 8A and 8B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 7A and 7B.

The example multiple-finger FET device of FIGS. 8A and 8B can be made to operate such that a drain of one FET acts as a source of its neighboring FET. Thus, the multiple-finger FET device as a whole can provide a voltage-dividing functionality. For example, an RF signal can be provided at one of the outermost p-doped regions (e.g., the leftmost p-doped region); and as the signal passes through the series of FETs, the signal's voltage can be divided among the FETs. In such an example, the rightmost p-doped region can act as an overall drain of the multi-finger FET device.

In some implementations, a plurality of the foregoing multi-finger FET devices can be connected in series as a switch to, for example, further facilitate the voltage-dividing functionality. A number of such multi-finger FET devices can be selected based on, for example, power handling requirement of the switch.

Examples of Bias and/or Coupling Configurations for Improved Performance

Described herein are various examples of how FET-based switch circuits can be biased and/or coupled to yield one or more performance improvements. In some embodiments, such biasing/coupling configurations can be implemented in SOI FET-based switch circuits. It will be understood that some of the example biasing/coupling configurations can be combined to yield a combination of desirable features that may not be available to the individual configurations. It will also be understood that, although described in the context of RF switching applications, one or more features described herein can also be applied to other circuits and devices that utilize FETs such as SOI FETs.

Example Configurations of Switch Circuits

In some radio-frequency (RF) applications, it is desirable to utilize switches having high linearity, as well as management of intermodulation distortion (IMD) such as IMD3 and IMD2. Such switch-related performance features can contribute significantly to system-level performance of cellular devices. In the context of silicon-on-oxide (SOI) switches, factors such as substrate-coupling (sometimes also referred to as substrate parasitics) and SOI-process can limit the performance achievable.

Such a limitation in performance of SOI switches can be addressed by extensive substrate crosstalk reduction techniques such as capacitive guard rings, and/or trap rich or deep trench isolation techniques. Such techniques typically have associated with them undesirable features such as being expensive, requiring relatively large areas, and requiring additional process steps. Also, such techniques can yield a desirable effect that is limited to an isolation feature.

Figure 9:
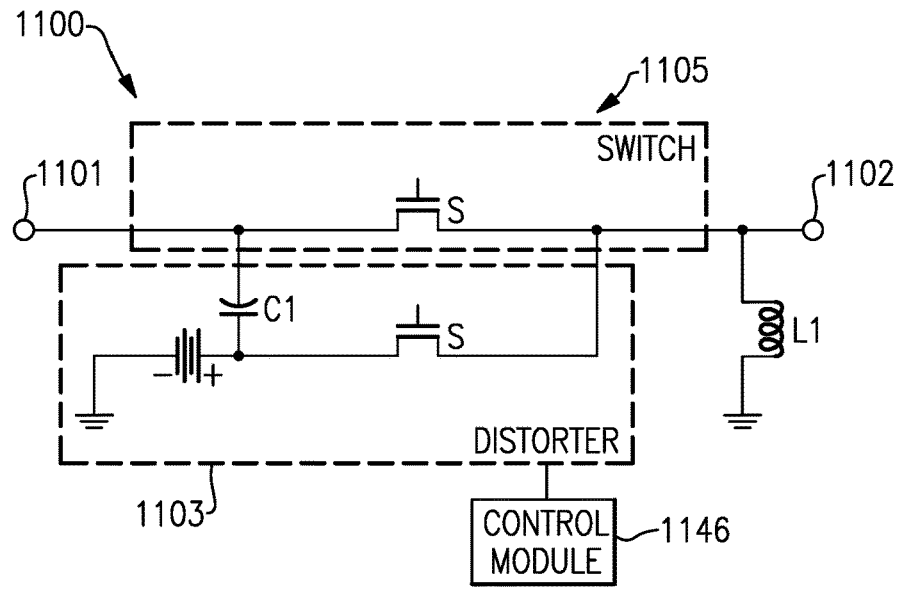
FIG. 9 illustrates an example switch circuit having a switch arm and a distorter arm that is configured to act as a compensation circuit to compensate for non-linearities in the switch arm.

In some implementations, performance of SOI switches can be improved by overcoming or reducing the foregoing effects associated with substrate parasitics and/or process variables. Accordingly, disclosed herein are systems and methods for reducing IMD in switches using parallel distorter circuits. By way of an example, FIG. 9 illustrates an example switch circuit 1100 having a switch arm 1105 and a distorter arm 1103, configured to act as a compensation circuit to compensate for non-linearities in the switch arm 1105. The switch circuit 1100 can include a plurality of FETs in the switch arm 1105 (e.g., a set, stack, or group of FETs) configured to provide switching functionality between a first node 1101 and a second node 1102. In certain embodiments, one or more of the FETs may be an SOI FET. In the switch arm 1105, individual FETs may include a gate, a body, a source, and a drain. A gate (e.g., a gate terminal) of a FET may be biased by a bias voltage provided by a gate bias circuit (not illustrated in FIG. 9) which may be coupled to the gate. A body (e.g., a body terminal) of a FET may be biased by a bias voltage provided by a body bias circuit (not illustrated in FIG. 9) which may be coupled to the body. In various embodiments, the first node 1101 may be an input node and may receive a signal, such as an RF signal. The second node 1102 may be an output node and may output the signal (such as an RF signal). The switch arm 1105 may output the signal (received at the first node 1101) via the second node 1102 when the switch arm 1105 is in an ON state (e.g., when the one or more FETs is in an ON state). The switch arm 1105, via the one or more FETs, may prevent (may stop) a signal received at the first node 1101 from being outputted via the second node 1102 when switch arm 1105 is in an OFF state (e.g., when the one or more FETs is in an OFF state).

As illustrated in FIG. 9, the switch arm 1105 is coupled in parallel with the distorter arm 1103 (e.g., a compensation circuit). The distorter arm 1103 includes a FET and is coupled to the switch arm 1105 at an input side (e.g., a side coupled to the input node 1101) through a DC-blocking capacitor C1. The distorter arm 1103 is directly coupled to the switch arm 1105 on an output side (e.g., a side coupled to the output node 1102). The switch circuit 1100 includes an inductor L1 coupled to a reference potential node, the inductor L1 coupled at a node/junction between the output node 1102 and the output of both the switch arm 1105 and the distorter arm 1103. The inductor L1 can be configured to direct DC signals to the reference potential node, providing an AC signal to the output node 1102 without or substantially without a DC component. The distorter arm 1103 includes a DC source to provide a bias voltage or current to the distorter FET in the distorter arm 1103. The switch arm 1105 and the distorter arm 1103 are separate for DC signals due to the DC-blocking capacitor C1.

In some embodiments, the node 1101 may receive a signal (e.g., an RF signal) having a power value and the node 1102 may output the signal when the switch arm 1105 is in an ON state. The number of FETs in the switch arm 1105 may be selected to allow the switch circuit 1100 to handle the power (e.g., power value) of the signal.

In some embodiments, the distorter arm 1103 may compensate for a non-linearity effect generated by the FETs of the switch arm 1105 when it is in an ON state (e.g., when the FETs of the switch arm 1105 receive an RF signal from the node 1101 and provide the RF signal to the node 1102). The distorter arm 1103 may compensate for the non-linearity effect generated by the switch arm 1105 independent of (e.g., regardless of) the frequency of the signal (e.g., RF signal) received by the switch arm 1105 (via node 1101) and provided to the node 1102.

The switch circuit 1100 can include a control module 1146 configured to control operation of one or more of: the FET(s) of the switch arm 1105, the FET(s) of the distorter arm 1103, a bias supply of the switch arm 1105, and the DC supply of the distorter arm 1103. For example, the control module 1146 may place the FET(s) of the switch arm 1105 in the ON state (e.g., may turn on the FET(s)). The control module 1146 may also place the distorter FET(s) of the distorter arm 1103 in the ON state when the switch arm is in the ON state. The control module 1146 may further control the DC supply to provide a targeted bias voltage or current to the distorter FET(s). The control module 1146 may further control the bias supply to provide a targeted bias voltage or current to the switch arm FET(s). In another example, the control module 1146 may place the switch arm 1105 in the OFF state (e.g., may turn off the FET(s)). The control module 1146 may also place the distorter FET(s) of the distorter arm 1103 in the OFF state when the switch arm 1105 is in the OFF state. However, in various embodiments, the distorter FET(s) may remain in the ON state when the switch arm 1105 is in the OFF state. The control module 1146 may be hardware (e.g., circuitry, dedicated logic, programmable logic, microcode, a processor, a field-programmable gate array (FPGA), an application-specific integrated circuit (ASIC), etc.), software (e.g., instructions run on a processor), firmware, or a combination thereof. The control module 1146 may be part of the switch circuit 1100 or may be separate from the switch circuit 1100 (e.g., the control module 1146 may reside in another component/circuit/module).

In some embodiments, the switch circuit 1100 may also include one or more bias/coupling circuits (as discussed in more detail in U.S. Pat. Pub. No. 2014/0009214). For example, a coupling circuit (discussed in more detail in U.S. Pat. Pub. No. 2014/0009214) may be coupled to one or more bodies of one or more of the FETs in the switch arm 1105 and/or the distorter arm 1103.

Figure 10:
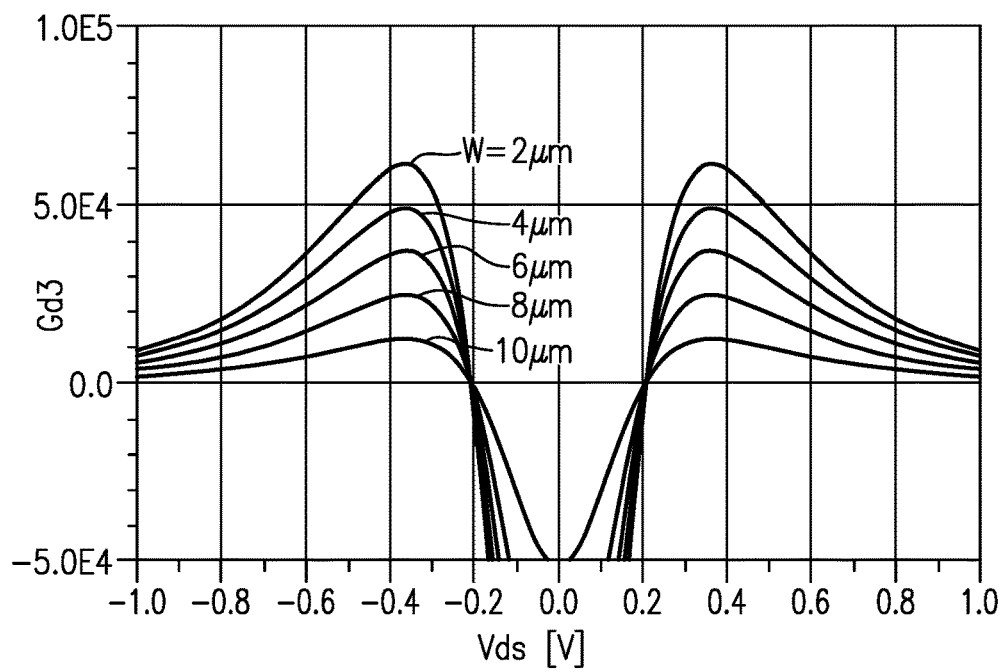
FIG. 10 illustrates curves for the third derivative of the drain current, gd3, as a function of drain-source voltage, Vds or Vd, and demonstrates that gd3 relates to a physical size of the FET.

The distorter arm 1103 an be configured to compensate for non-linearity in the switch arm 1105. For a FET in its ON state, the drain current, Id, increases almost linearly with the drain-source voltage, Vds, until saturation. FIG. 10 illustrates curves for the third derivative of the drain current, gd3, as a function of drain-source voltage, Vds or Vd. The third derivative, gd3, is related to third order intermodulation distortion, IMD3. As seen from the plot in FIG. 10, gd3 relates to a physical size of the FET. The plot in FIG. 10 illustrates dependence of gd3 on gate width size, ranging from 2 μm to 10 μm.

Figure 11A:
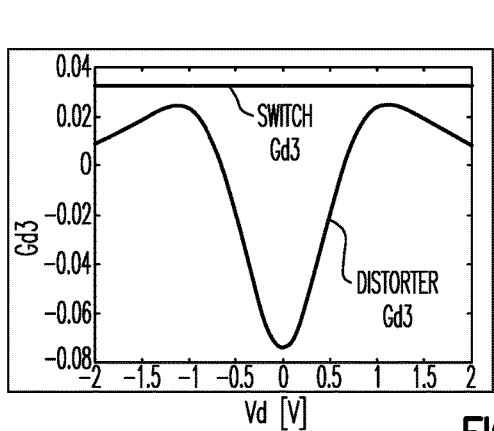
FIGS. 11A, 11B, and 11C illustrate plots showing compensation of gd3 of a switch arm having a stack of FETs by a distorter arm having one or more FETs.
Figure 11A:
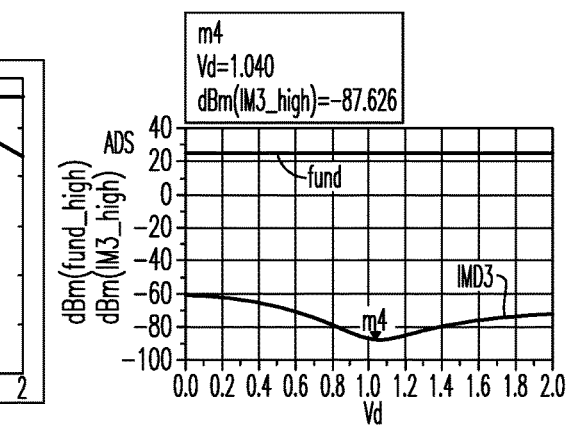
Figure 11B:
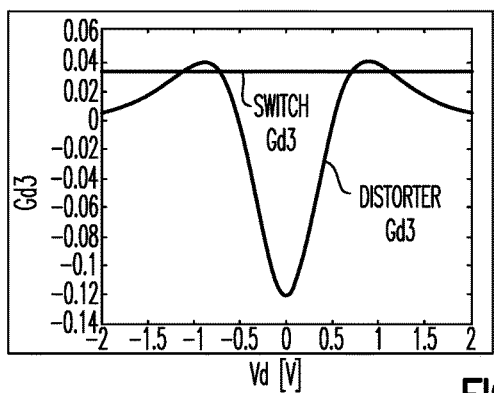
Figure 11B:
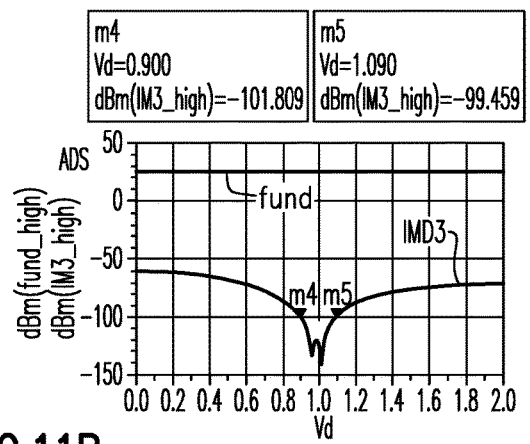
Figure 11C:
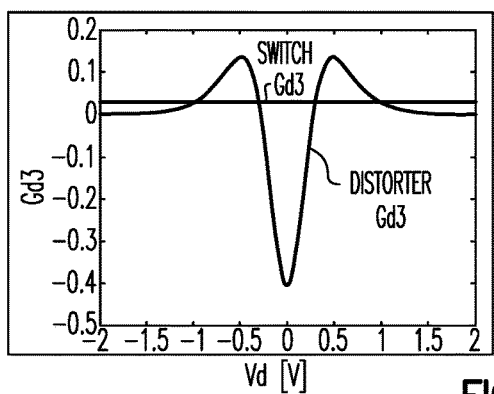
Figure 11C:
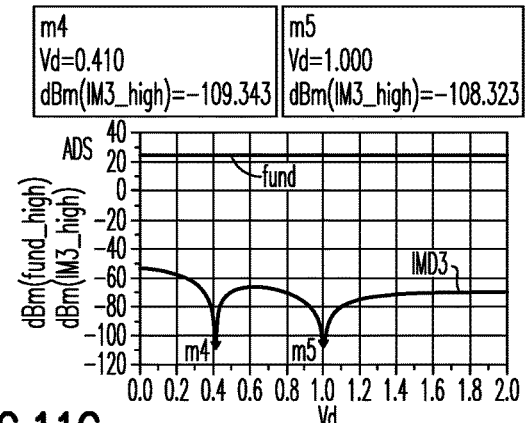

FIGS. 11A-11C illustrate plots showing compensation of gd3 of a switch arm having a stack of FETs by a distorter arm having one or more FETs. On the left of each of FIGS. 11A-11C, a plot is shown with the switch arm gd3 and the distorter arm gd3, as labeled in the plots. On the right of each of FIGS. 11A-11C, a plot is shown with the fundamental signal output from the switch circuit (labeled "fund") and the composite gd3 signal as a function of Vd. FIG. 11A illustrates a circumstance where there is under-compensation of the switch gd3 by the distorter arm. FIG. 11B illustrates a circumstance where the distorter arm gd3 compensates for the switch arm gd3 over a range of Vd values (e.g., between the points labeled m4 and m5). FIG. 11C illustrates a circumstance where the distorter arm gd3 over-compensates for the switch arm gd3 so that there are a couple of good compensation points (labeled m4 and m5) but between these points there is not a good compensation. Thus, the distorter arm can be tuned to provide a window of compensation for non-linearity effects in the switch arm. The FETs of the distorter arm can be tuned to provide targeted compensation through selection of the size of the FET(s) used in the distorter arm as well as the bias voltage or current provided to the FET(s).

The plots in FIGS. 11A-11C were generated using simulations of FETs in the switch arm and the distorter arm. For the switch arm, the simulation included 12 FETs connected in series, each FET having a gate width of about 3.5 mm. For the distorter arm, a single FET was used with a gate width of about 20 μm. In addition, the gd3 of the switch arm in the left-hand plots of FIGS. 11A-11C are actually the inverse of the gd3 of the switch arm (e.g., −1 times the actual gd3 values) to better show where good gd3 compensation occurs (e.g., where the two lines in the graph intersect or are near one another).

Figure 12:
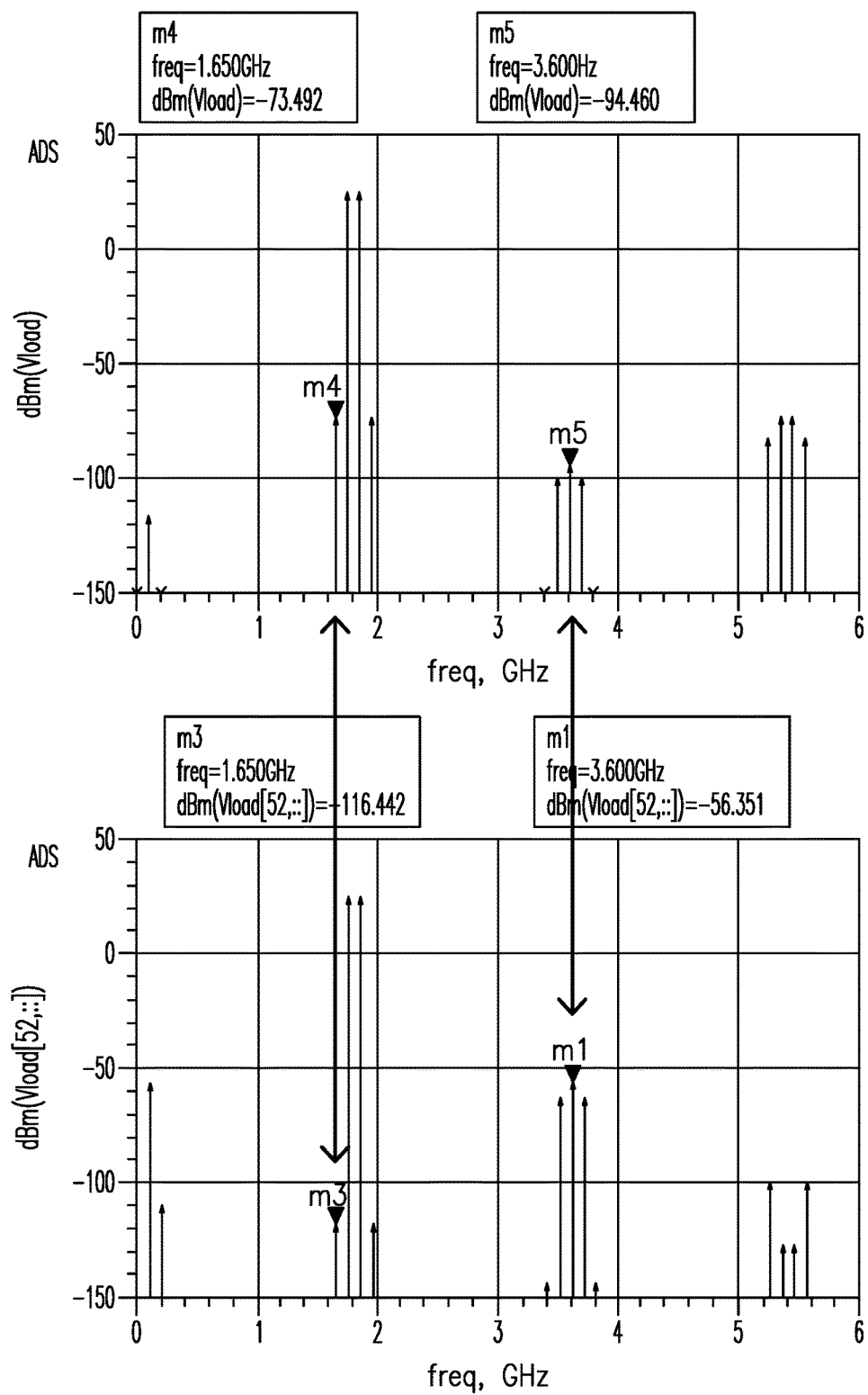
FIG. 12 illustrates results of a simulation of the switch circuit described herein with reference to FIG. 11, operating to switch signals with two fundamental frequencies.

FIG. 12 illustrates results of a simulation of the switch circuit 1100 described herein with reference to FIG. 11, operating to switch signals with two fundamental frequencies represented by the two tallest lines just below 2 GHz. In the top plot, signal power is illustrated as a function of frequency for the switch circuit where the distorter arm is not present. In the bottom plot, the signal power is illustrated as a function of frequency for the switch circuit with a distorter arm. In the switch arm, Vd is equal to about 0 and in the distorter arm there is a small drain-source voltage, Vd≠0. The simulation illustrates that the distorter arm reduces third-order intermodulation distortion (represented by the change in power from the point m4 in the top plot to the point m3 in the bottom plot). In certain embodiments, the switch circuit 1100 increases harmonic distortion with the distortion arm included (represented by the change in power from the point m5 in the top plot to the point m1 in the bottom plot).

Figure 13:
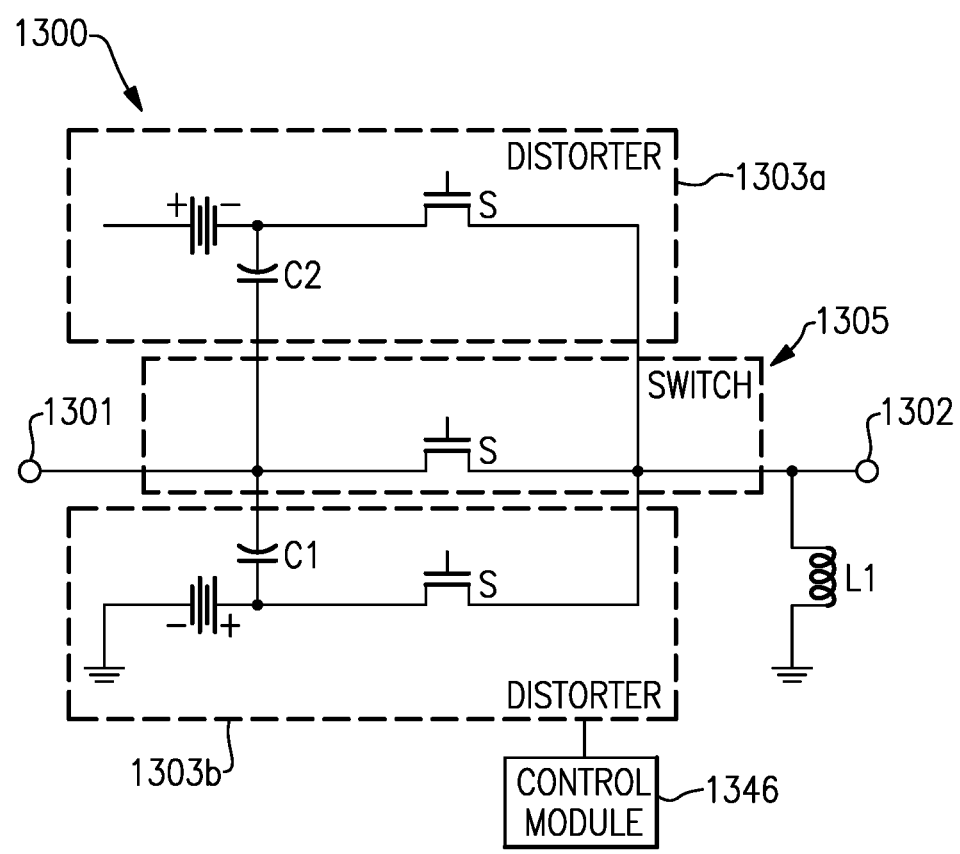
FIG. 13 illustrates an example switch circuit that includes dual parallel distorter arms in parallel with a switch arm that is configured to reduce or at least not significantly increase harmonic distortion while decreasing IMD3 non-linearity in the switch circuit.

It may be beneficial to not increase or to reduce harmonic distortion in switching circuits in addition to reducing IMD3 distortion. Accordingly, FIG. 13 illustrates an example switch circuit 1300 that includes dual parallel distorter arms 1303a, 1303b in parallel with a switch arm 1305 that is configured to reduce or at least not significantly increase harmonic distortion while decreasing IMD3 non-linearity in the switch circuit 1300. The switch circuit 1300 includes input node 1301, output node 1302, and inductor L1 similar to the switch circuit 1100 described herein with reference to FIG. 11. The switch arm 1305 is the same or similar to the switch arm 1105 described herein with reference to FIG. 11, including one or more FETs to selectively pass signals from the input node 1301 to the output node 1302. Each distorter arm 1303a, 1303b is the same or similar to the distorter arm 1103 described herein with reference to FIG. 11, and are coupled to the switch arm 1305 through respective DC-blocking capacitors C1, C2. However, the distorter arms 1303a, 1303b differ in that they are biased in opposite ways so that even-order harmonics effectively or substantially cancel. For the distorter arms 1303a, 1303b, the absolute value of the bias is the same, but with opposite signs. This is shown in the switch circuit 1300 by the power supplies in the respective distorter arms 1303a, 1303b being configured to provide opposite biasing to the respective FETs. The control module 1346 operates similarly to the control module 1146 described herein with reference to FIG. 11, except that the control module 1346 controls the dual distorter arms 1303a, 1303b rather than a single distorter arm. Due at least in part to the symmetry of the circuit 1300, even-order harmonics can be canceled out. Furthermore, IMD3 of the circuit 1300 can be reduced due at least in part to the distorter arms 1303a, 1303b providing compensating gd3 signals to be combined with gd3 of the switch arm 1305.

Figure 14:
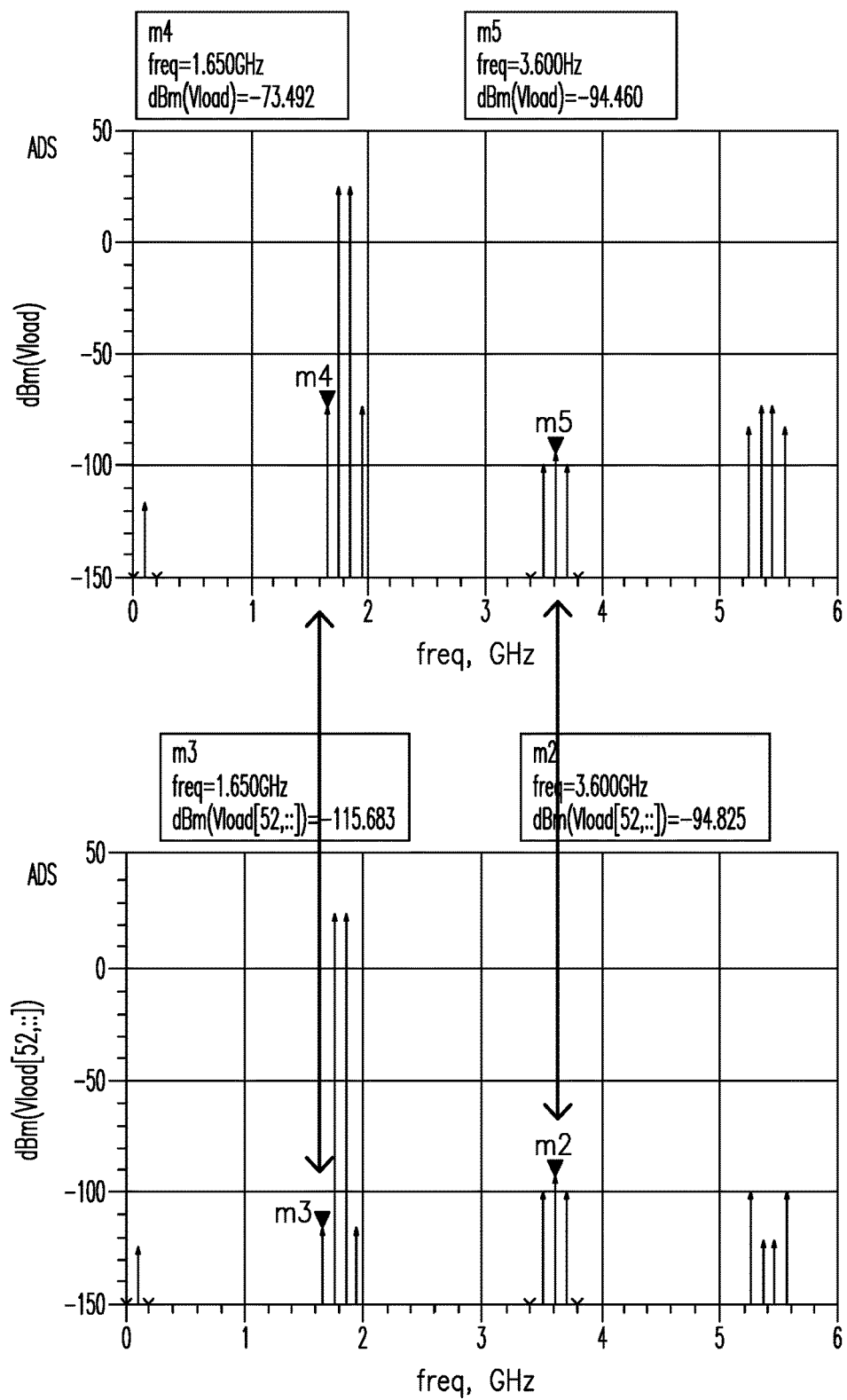
FIG. 14 illustrates results of a simulation of the switch circuit described herein with reference to FIG. 13, operating to switch signals with two fundamental frequencies.

FIG. 14 illustrates results of a simulation of the switch circuit 1300 described herein with reference to FIG. 13, operating to switch signals with two fundamental frequencies represented by the two tallest lines just below 2 GHz. In the top plot, signal power is illustrated as a function of frequency for the switch circuit where the dual distorter arms are not present. In the bottom plot, the signal power is illustrated as a function of frequency for the switch circuit with the dual distorter arms. In the switch arm, Vd is equal to about 0 and in the distorter arms there are small drain-source voltage, Vd≠0, with equal magnitude and opposite signs. The simulation illustrates that the dual distorter arms reduce third-order intermodulation distortion (represented by the change in power from the point m4 in the top plot to the point m3 in the bottom plot) and does not significantly affect harmonic distortion (represented by the change in power from the point m5 in the top plot to the point m2 in the bottom plot).

Figure 15:
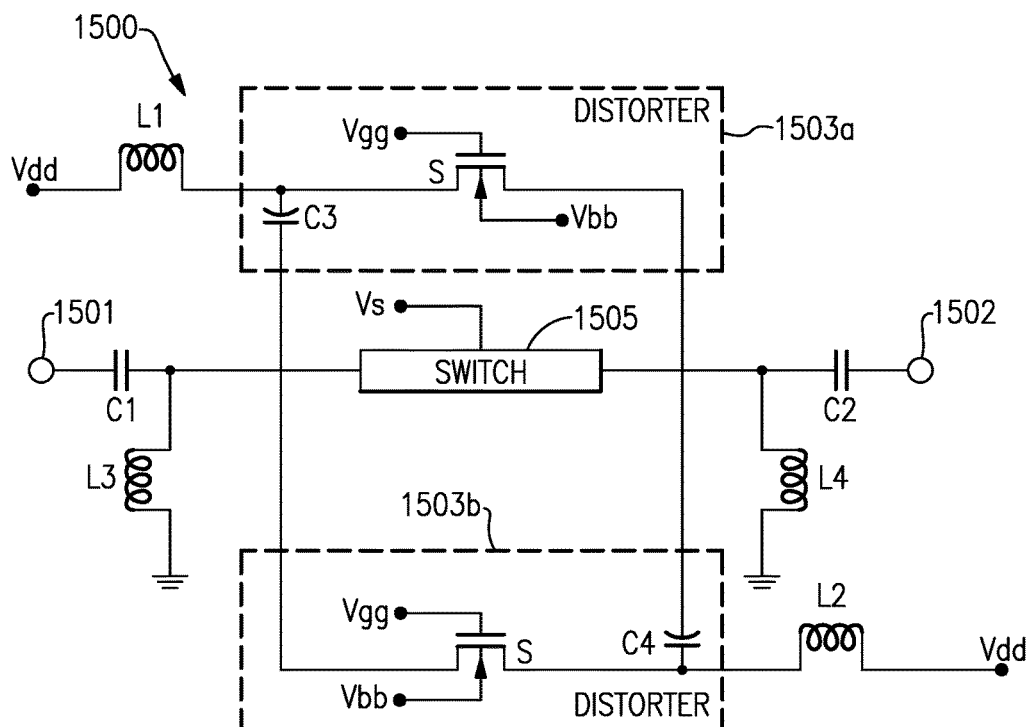
FIG. 15 illustrates an example switch circuit that includes dual parallel distorter arms in parallel with a switch arm that is configured to reduce or at least not significantly increase harmonic distortion while decreasing IMD3 non-linearity in the switch circuit.

FIG. 15 illustrates an example switch circuit 1500 that includes dual parallel distorter arms 1503a, 1503b in parallel with a switch arm 1505 that is configured to reduce or at least not significantly increase harmonic distortion while decreasing IMD3 non-linearity in the switch circuit 1500. The switch arm 1505 includes twelve 3.5 mm FETs and are biased with switch voltage Vs. Each distorter arm 1503a, 1503b includes a single 3.75 μm FET, meaning that the FET in each distorter arm is about 1000 times smaller than the FETs of the switch arm 1505. Accordingly, it is to be understood that the IMD3 non-linearities of the switching circuits described herein can be reduced using FETs that are orders of magnitude smaller than the FETs being used to switch RF signals in the switching circuit.

The switch circuit 1500 includes input node 1501 and output node 1502 configured respectively to receive an input signal and to output an output signal. At the input node 1501, the switch circuit 1500 includes a DC-blocking capacitor C1 and a DC feed inductor L3. Similarly, the output node 1502 includes a DC-blocking capacitor C2 and a DC feed inductor L4. The DC-blocking capacitors C1, C2 and DC feed inductors L3, L4 operate to filter DC signals out so that the switch circuit 1500 provides AC signals that are substantially free from DC offset voltages to the switch arm 1505 and at the output node 1502.

Each distorter arm 1503a, 1503b receives a bias voltage from a voltage source, Vdd. The voltage source, Vdd, provides current and voltage to the distorter arms 1503a, 1503b with the same magnitude but opposite bias. Between the voltage source, Vdd, and each distorter arm 1503a, 1503b there is an inductor L1, L2. Furthermore, there are DC-blocking capacitors that couple the source terminals of the respective FETs of the distorter arms 1503a, 1503b to the switch arm 1505. The FETs of the distorter arms 1503a, 1503b receive gate bias voltages, Vgg, and body bias voltages, Vbb, from one or more voltage supplies.

By way of example and not intended to limit the scope of the disclosure, example values of the components of the switch circuit 1500 are provided. The capacitors C3, C4 can each have a value of about 100 pF. The inductors L1, L2 can each have a value of about 100 nH. The inductors L3, L4 can each have a value of about 20 nH. In some embodiments, increasing the capacitance of capacitors C3, C4 improves the cancellation of IMD3 non-linearity effects of the switch circuit 1500. For example, where the capacitors have a value of about 100 nH, IP3 of the circuit 1500 is about −85 dBm, where the capacitors have a value of about 250 nH, IP3 of the circuit 1500 is about −90 dBm, and where the capacitors have a value of about 500 nH, IP3 of the circuit 1500 is about −95 dBm.

Figure 16:
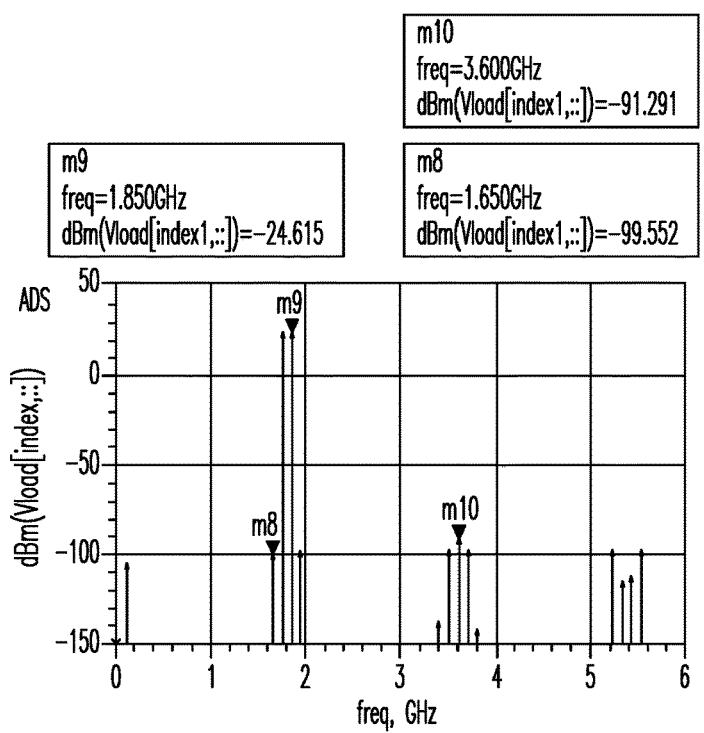
FIG. 16 illustrates results of a simulation of the switch circuit described herein with reference to FIG. 15, operating to switch signals with two fundamental frequencies.

FIG. 16 illustrates results of a simulation of the switch circuit 1500 described herein with reference to FIG. 15, operating to switch signals with two fundamental frequencies represented by the two tallest lines just below 2 GHz (e.g., 1.85 GHz at point m9). The plot represents performance of the switch with the dual distorter arms 1503a, 1503b and can be compared to the top plots in FIGS. 12 and 14 which represent performance of the switch circuit without any distorter arm. In the plot, signal power is illustrated as a function of frequency for the switch circuit with the dual distorter arms. In the switch arm, Vd is equal to about 0 and in the distorter arms there are small drain-source voltage, Vd≠0, with equal magnitude and opposite signs. The simulation illustrates that the dual distorter arms reduce third-order intermodulation distortion (represented by the change in power from the point m4 in the plots in FIGS. 12 and 14 to the point m8 in the plot or a change from −73.492 dBm to −99.552 dBm) and slightly increases harmonic distortion (represented by the change in power from the point m5 in the plots in FIGS. 12 and 14 to the point m10 in the plot or a change from −94.460 dBm to −91.291).

Figure 17:
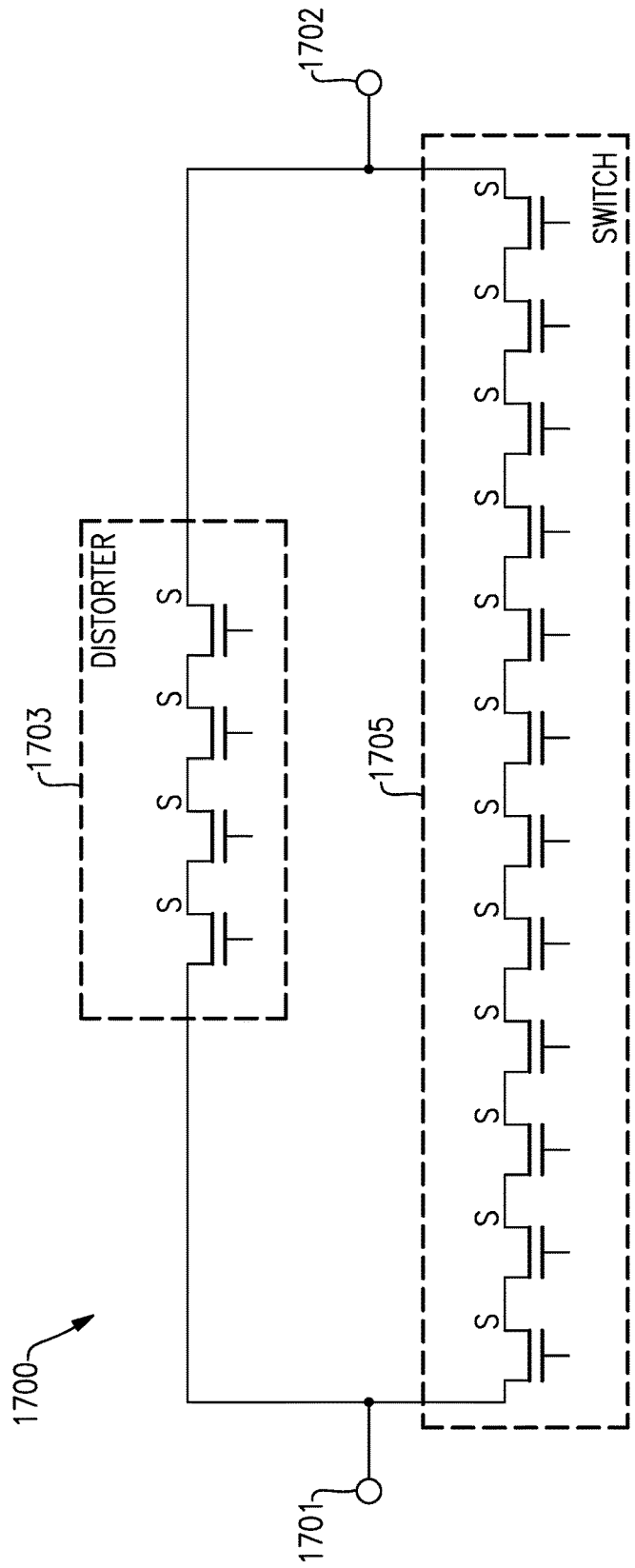
FIG. 17 illustrates a portion of a switch circuit having a switch arm with multiple FETs and a distorter arm that includes fewer, smaller FETs.

In some embodiments, putting the switch in an OFF state from an ON state can induce a large voltage drop across the FETs in the distorter arms. If that voltage drop is sufficiently high, the FETs in the distorter arms may break down. By increasing the number of FETs in each distorter arm, the effective break-down voltage of the distorter arm may be increased. Accordingly, FIG. 17 illustrates a portion of a switch circuit 1700 having a switch arm 1705 and a distorter arm 1703 between an input node 1701 and an output node 1702. The switch arm 1705 includes twelve 3.5 mm FETs and the distorter arm 1703 includes four smaller (e.g., 3.75 μm) FETs. It is to be understood that the number of FETs in the distorter arm 1703 can be different from four, being less than four or greater than four. It should also be understood that the switch circuit 1700 can include dual distorter arms 1703 although a single distorter arm is illustrated in FIG. 17. By increasing the number of FETs in the distorter arm 1703, the switch circuit 1700 can be more robust when switching from an ON state to an OFF state. In the switch circuit, Vds for the switch arm 1705 can be 0 (e.g., Vds=0) and Vds for the distorter arm 1703 can be different from 0 (e.g., Vds≠0).

Table 1 provides simulated results for varying parameters of the distorter arm 1703 in the switch circuit 1700. By increasing the number of FETs in the distorter arm, resistance to voltage break down can be increased. Increasing the number of FETs may also increase the power requirements of the switch circuit.

TABLE 1

| | Stack Height | | |
|---|---|---|---|
| | 1 | 2 | 3 |
| Wtot (μm) | 3.75 | 16 | 92 |
| Vds (V) | 0.45 | 0.6 | 1.1 |
| Ids (mA) | 1.5 | 7.0 | 37 |
| DC Power (mW) | 1.4 | 8.4 | 81.4 |

Figure 18:
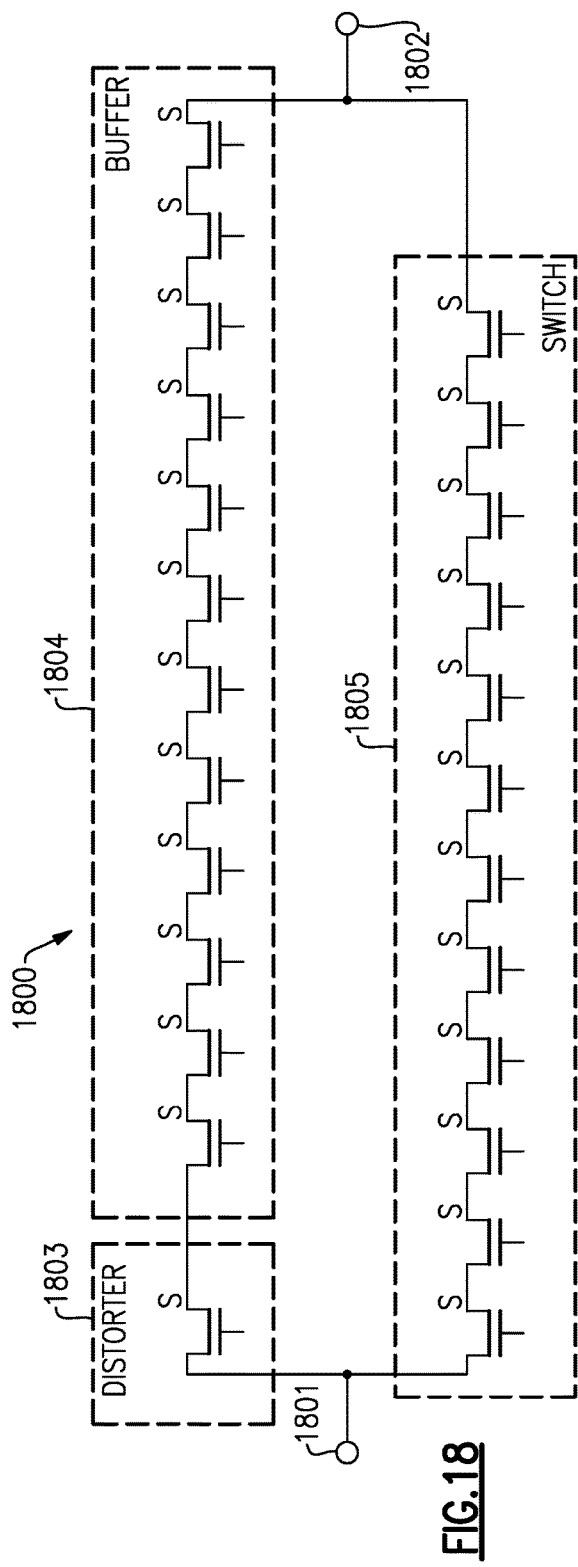
FIG. 18 illustrates an example switch circuit with a switch arm, distorter arm, and a voltage buffer in series with the distorter arm.

It may be advantageous to reduce the power requirements of a switch circuit while maintaining the ability to have a robust distorter arm when switching from an ON state to an OFF state. Accordingly, FIG. 18 illustrates an example switch circuit 1800 with a switch arm 1805, distorter arm 1803, and a voltage buffer 1804 in series with the distorter arm 1803. The switch circuit 1800 includes input node 1801 and output node 1802 to respectively receive an input signal and to output an output signal. The switch arm 1805 includes twelve 3.5 mm FETs and the distorter arm 1803 includes a single smaller FET (e.g., 6.2 μm). The voltage buffer 1804 includes a stack of twelve FETs, individual FETs in the stack being bigger than the distorter FET and smaller than a switch arm FET. In some embodiments, the FETs in the voltage buffer 1804 can each have a gate width of about 200 μm.

In the OFF state, the voltage buffer 1804 absorbs the majority of the voltage drop, thereby protecting the distorter FET in the distorter arm 1803. Table 2 provides bias configurations of the switch arm 1805, distorter arm 1803, and voltage buffer 1804 in an ON state and OFF state of the switch circuit 1800.

TABLE 2

| | Switch | Buffer | Distorter |
|---|---|---|---|
| ON state | ON | ON | ON, Vds ≠ 0 |
| OFF state | OFF | OFF | ON, Vds = 0 |

As can be seen in Table 2, the distorter arm 1803 can remain in an ON state even when the switch circuit switches to an OFF state. Because the voltage buffer 1804 is in series with the distorter arm 1803 and includes a plurality of larger FETs, the majority of the voltage drop occurs across the voltage buffer 1804, protecting the distorter FET in the distorter arm 1803 from breaking down due to a large voltage swing in the transition from the ON state to the OFF state. In the switch circuit, the FETs in the voltage buffer 1804 have Vds equal to 0, like the FETs of the switch arm 1805. The FET of the distorter arm 1803 always remains in the ON state, but the voltage Vds changes from 0 in the OFF state to non-zero in the ON state. In the ON state, the majority of the voltage drop across the arm parallel to the switch arm 1805 is on the distorter arm 1803 rather than the voltage buffer 1804. Because the majority of the voltage drop occurs on the distorter arm 1803 rather than the voltage buffer 1804, the input power is used to generate signals that reduce or cancel IMD3 non-linearities in the switch circuit 1800. In the OFF state, the majority of the voltage drop is on the voltage buffer 1804 due at least in part to maintaining the distorter FET in an ON state. Accordingly, the distorter FET in the distorter arm 1803 is protected and the IMD generated by the distorter arm 1803 is negligible in the switch circuit 1800 OFF state.

Figure 19:
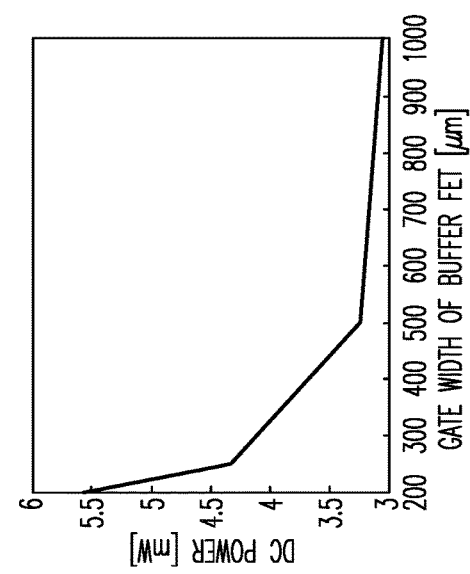
FIG. 19 illustrates a plot of the DC power consumption of the switch circuit of FIG. 18 as a function of gate width of the voltage buffer.

FIG. 19 illustrates a plot of the DC power consumption as a function of gate width of the voltage buffer. As the gate width increases, the power consumption decreases. This is due at least in part to increasing the fraction of voltage drop across the distorter FET in the distorter arm 1803 in the ON state relative to the voltage buffer 1804. In some embodiments, the power consumption per DPDT can be reduced to be less than or equal to about 3 mW.

Table 3 summarizes the results of simulating the performance of a switch circuit having a switch arm, distorter arm and a voltage buffer configured in a manner similar to the switch circuit 1800 described herein in FIG. 18, with the switch circuit operated as a dual pole, dual throw (DPDT) switch. The inclusion of a distorter arm with voltage buffer decreases IMD3 of the DPDT switch by more than 20 dB.

TABLE 3

| | On Arm | Off Arm | DPDT |
|---|---|---|---|
| No Distorter | −75 dB | −99 dB | −75 dB |
| Distorter | −121 dB | −99 dB | −99 dB |

Figure 20:
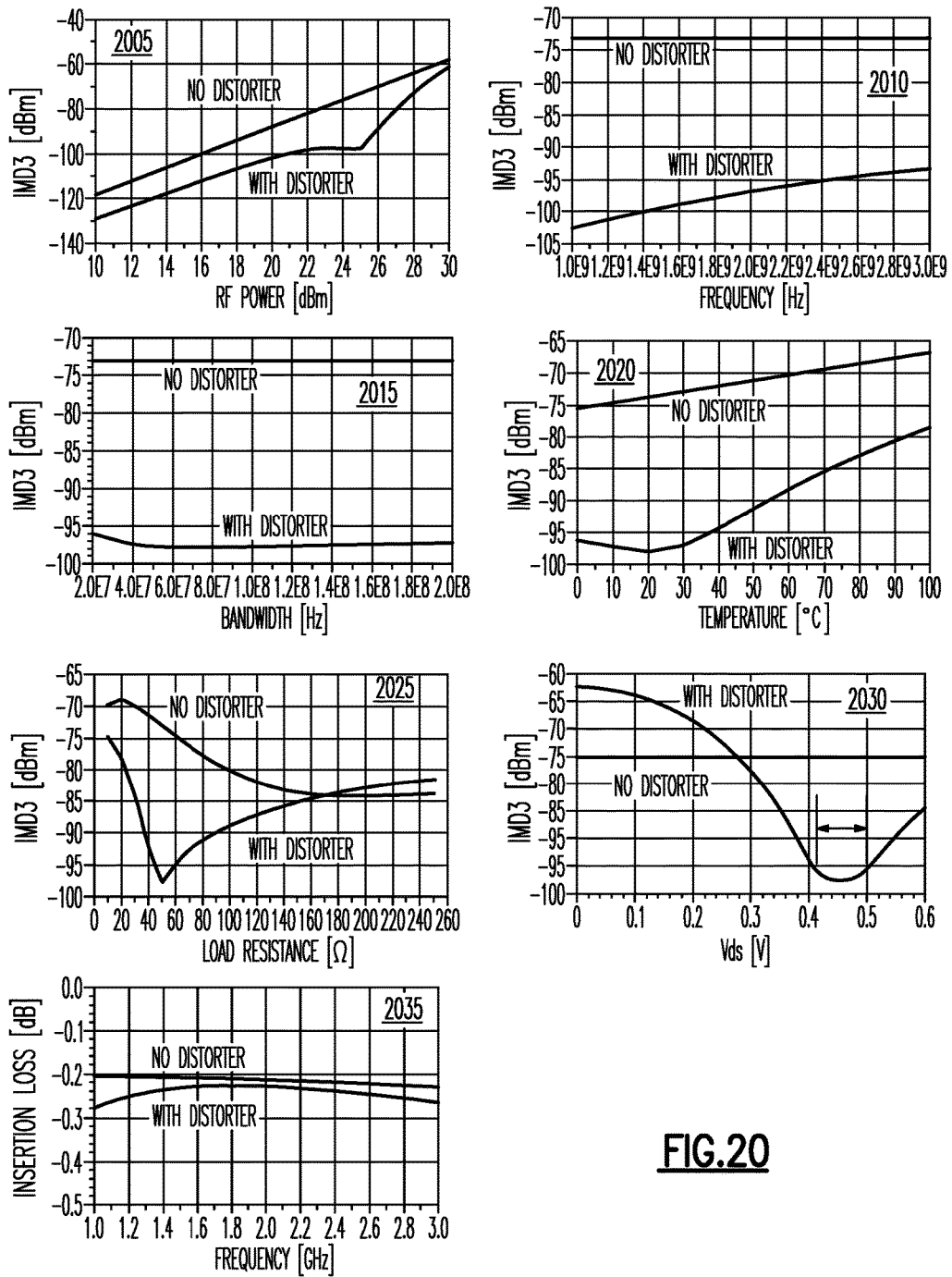
FIG. 20 illustrates various plots of performance of the switch circuit of FIG. 18 configured as a DPDT switch.

FIG. 20 illustrates various plots of performance of the switch circuit configured as a DPDT switch. In each plot, comparisons are made between a DPDT switch with and without a distorter, as described herein. It should be noted that the simulated DPDT switch with distorter was tailored to provide enhanced performance characteristics at about 25 dBm power, 50Ω load resistance, and 1.8 GHz frequency. These operating points can be changed to provide enhanced performance characteristics at different powers, load resistances, and/or frequencies. In the plot of IMD3 as a function of Vds, it is shown that there is a range of Vds values that provide beneficial or targeted IMD3 cancellation (e.g., between about 0.4 and 0.5 V). These plots illustrate that the distorter arms disclosed herein can improve the operation of switching circuits over a wide range of input power, carrier frequency, signal bandwidth, operating temperature, mismatch, Vds, and the like.

Figure 21:
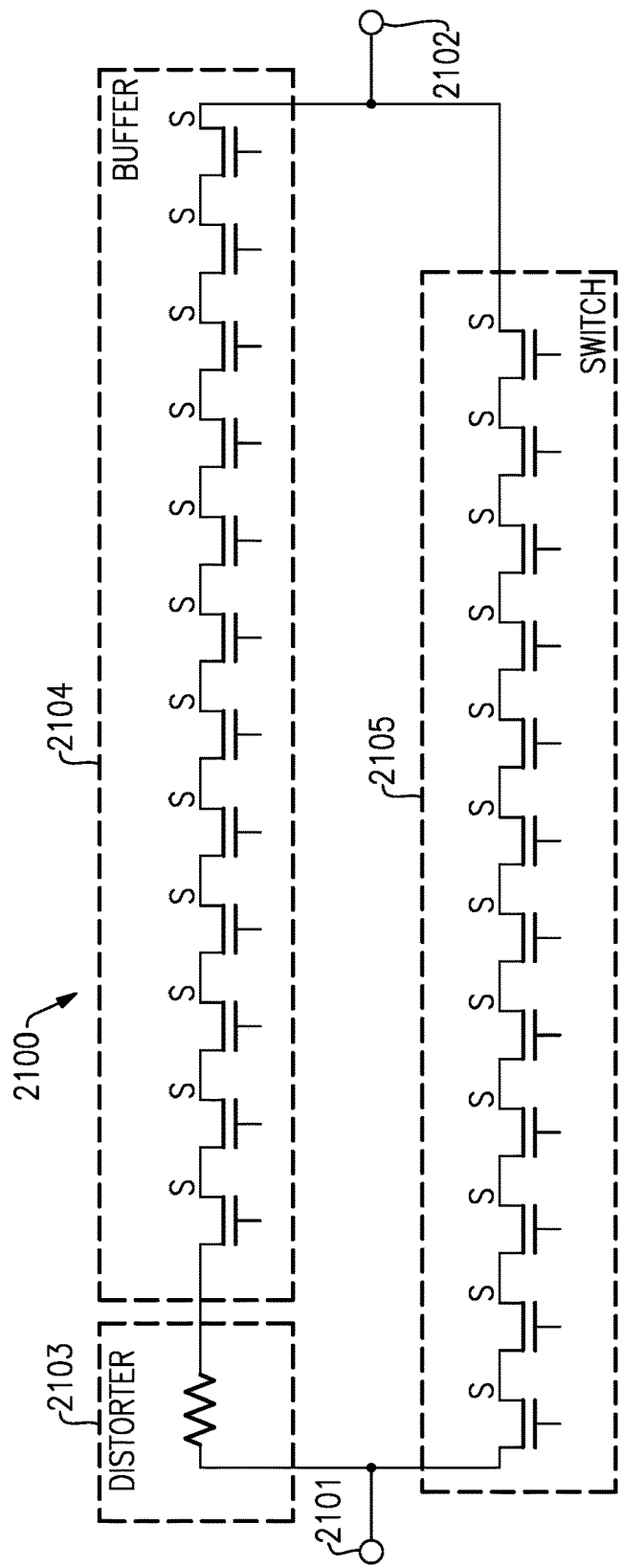
FIG. 21 illustrates another example switch circuit configured similarly to the switch circuit of FIG. 18 but having a non-linear resistor in the distorter arm rather than a FET.

FIG. 21 illustrates another example switch circuit 2100 configured similarly to the switch circuit 1800 but having a non-linear resistor in the distorter arm 2103 rather than a FET. As described herein with reference to FIG. 18, the distorter arm 1803 with distorter FET put the distorter FET in the ON state regardless of whether the switch circuit operated in the ON state or OFF state. Accordingly, the FET can be replaced with a non-linear resistor, as illustrated in the switch circuit 2100 of FIG. 21.

Figure 22:
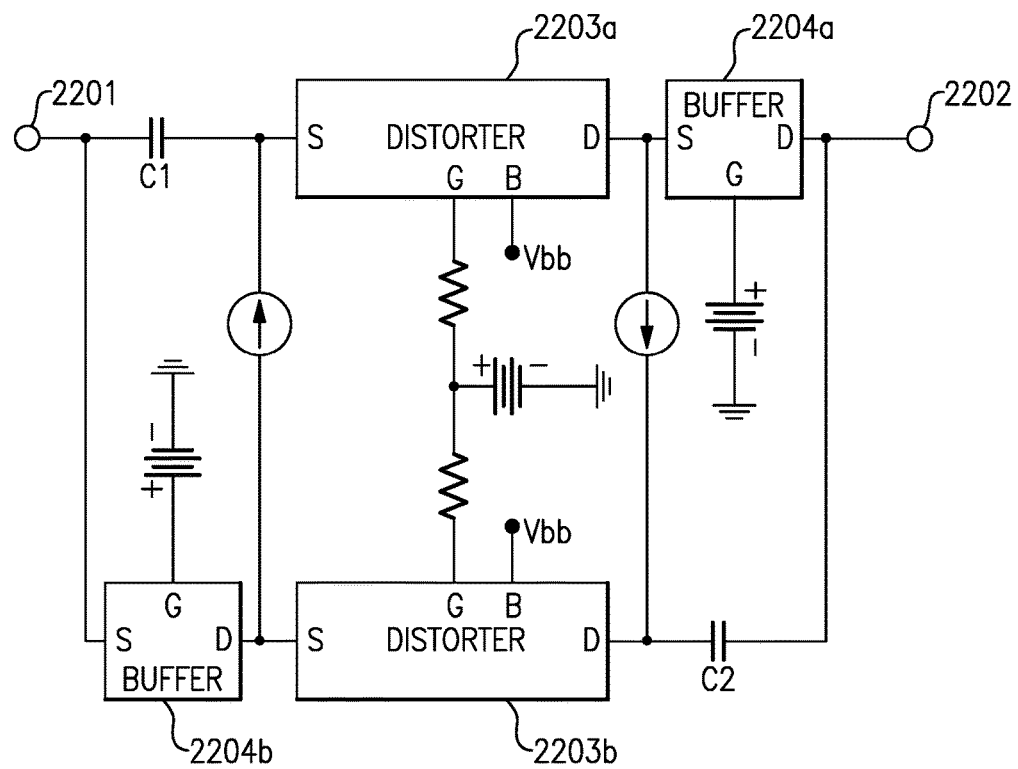
FIG. 22 illustrates an example biasing circuit for a switch circuit, as described herein.

FIG. 22 illustrates an example biasing circuit 2200 for a switch circuit, as described herein. The biasing circuit 2200 is configured to bias the distorter arms 2203 and the voltage buffers 2204 and not a switch arm. This is because, in some embodiments, it is undesirable to bias the switch arm. The biasing circuit 2200 includes distorters 2203a, 2203b having source, drain, gate and body terminals. Similarly, the biasing circuit 2200 includes buffers 2204a, 2204b having source, gate, and drain terminals. For reference, input node 2201 and output node 2202 are shown. Voltage Vbb is provided to the body terminals of the distorter arms 2203a, 2203b. A power supply provides a DC voltage to the gate terminals of the distorter arms 2203a, 2203b. Similarly, power supplies provide voltages to the gate terminals of the voltage buffers 2204a, 2204b. The biasing circuit includes DC-blocking capacitors C1, C2 at the input node 2201 and output node 2202, respectively.

The biasing circuit 2200 includes current sources to drive currents to the distorters 2203a, 2203b, as shown. The current sources can generate a current loop in the biasing circuit 2200, where the current loop is formed with the two distorters 2203a, 2203b and the two current sources. Due at least in part to the high impedance of the current sources, the RF choke between the DC bias source and the distorters 2203a, 2203b can be reduced or eliminated.

In some embodiments, the switch circuits described herein may also include one or more bias/coupling circuits (as discussed in more detail in U.S. Pat. Pub. No. 2014/0009214). For example, a coupling circuit (discussed in more detail in U.S. Pat. Pub. No. 2014/0009214) may be coupled to one or more bodies of one or more of the FETs in the switch arms, distorter arms, and/or voltage buffers. One having ordinary skill in the art understands that the various values for the capacitances and/or resistances may be used in the distorter arms disclosed herein.

In some implementations, the foregoing example configurations described in reference to FIGS. 9, 13, 15, 17, 18 and 21 (and generally described herein) may allow significant or substantially complete cancellation of non-linearity effects associated with one or more SOI FET based RF switches.

Examples of Implementations in Products

Various examples of FET-based switch circuits and bias/coupling configurations described herein can be implemented in a number of different ways and at different product levels. Some of such product implementations are described by way of examples.

Semiconductor Die Implementation

Figure 23A:
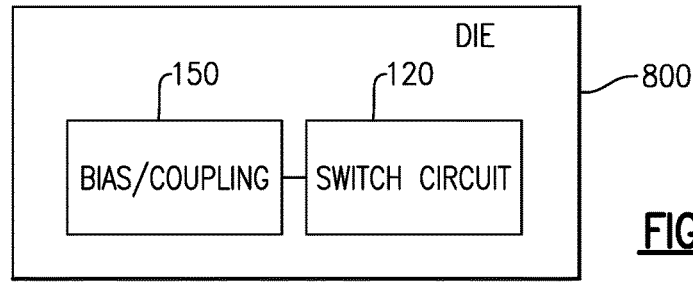
FIGS. 23A, 23B, 23C, and 23D schematically illustrate non-limiting examples of implementations of the switch circuits described herein on one or more semiconductor die.
Figure 23B:
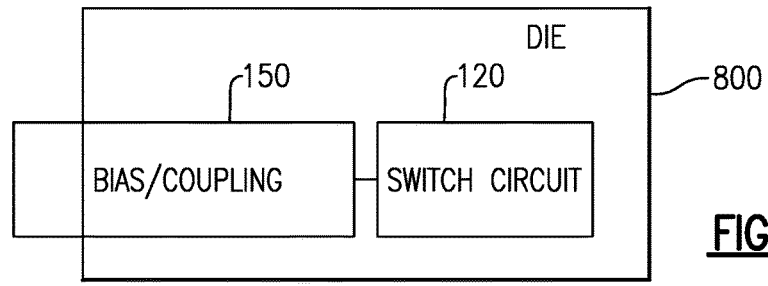

FIGS. 23A-23D schematically show non-limiting examples of such implementations on one or more semiconductor die. FIG. 23A shows that in some embodiments, a switch circuit 120 and a bias/coupling circuit 150 having one or more features as described herein can be implemented on a die 800. In addition, a distortion arm and/or voltage buffer (e.g., distortion arm 903 illustrated in FIG. 9, distortion arms 1303a, 1303b illustrated in FIG. 13, distortion arms 1503a, 1503b illustrated in FIG. 15, distortion arm 1703 illustrated in FIG. 17, distortion arm 1803 and voltage buffer 1804 illustrated in FIG. 18, distortion arm 2103 and voltage buffer 2104 illustrated in FIG. 18, and biasing circuit 2200 illustrated in FIG. 22) may also be implemented on the die 800. FIG. 23B shows that in some embodiments, at least some of the bias/coupling circuit 150 can be implemented outside of the die 800 of FIG. 23A. In addition, at least some or part of a distortion arm and/or voltage buffer (e.g., distortion arm 903 illustrated in FIG. 9, distortion arms 1303a, 1303b illustrated in FIG. 13, distortion arms 1503a, 1503b illustrated in FIG. 15, distortion arm 1703 illustrated in FIG. 17, distortion arm 1803 and voltage buffer 1804 illustrated in FIG. 18, distortion arm 2103 and voltage buffer 2104 illustrated in FIG. 18, and biasing circuit 2200 illustrated in FIG. 22) may also be implemented outside of the die 800.

Figure 23C:
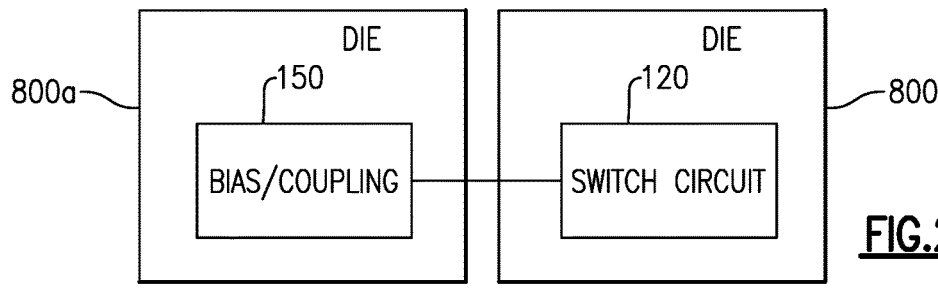
Figure 23D:
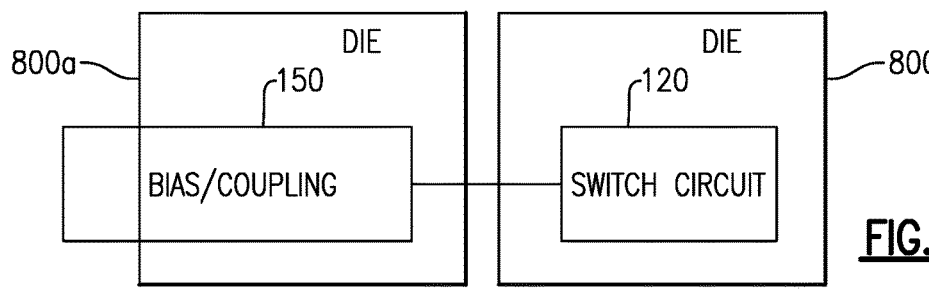

FIG. 23C shows that in some embodiments, a switch circuit 120 having one or more features as described herein can be implemented on a second die 800b, and a bias/coupling circuit 150 having one or more features as described herein can be implemented on a first die 800a. In addition, a distortion arm and/or voltage buffer (e.g., distortion arm 903 illustrated in FIG. 9, distortion arms 1303a, 1303b illustrated in FIG. 13, distortion arms 1503a, 1503b illustrated in FIG. 15, distortion arm 1703 illustrated in FIG. 17, distortion arm 1803 and voltage buffer 1804 illustrated in FIG. 18, distortion arm 2103 and voltage buffer 2104 illustrated in FIG. 18, and biasing circuit 2200 illustrated in FIG. 22) may also be implemented on the first die 800a. FIG. 23D shows that in some embodiments, at least some of the bias/coupling circuit 150 can be implemented outside of the first die 800a of FIG. 23C. In addition, at least some or part of a distortion arm and/or voltage buffer (e.g., distortion arm 903 illustrated in FIG. 9, distortion arms 1303a, 1303b illustrated in FIG. 13, distortion arms 1503a, 1503b illustrated in FIG. 15, distortion arm 1703 illustrated in FIG. 17, distortion arm 1803 and voltage buffer 1804 illustrated in FIG. 18, distortion arm 2103 and voltage buffer 2104 illustrated in FIG. 18, and biasing circuit 2200 illustrated in FIG. 22) may also be implemented outside of the first die 800a.

Packaged Module Implementation

Figure 24A:
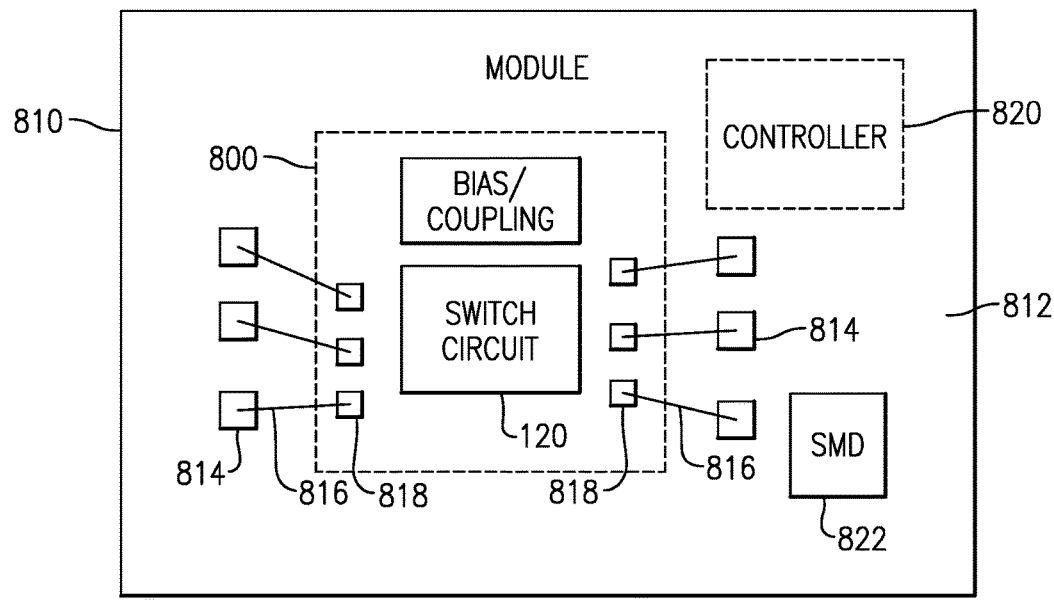
FIGS. 24A and 24B illustrate that one or more die having one or more features described herein can be implemented in a packaged module.

In some embodiments, one or more die having one or more features described herein can be implemented in a packaged module. An example of such a module is shown in FIGS. 24A (plan view) and 24B (side view). Although described in the context of both of the switch circuit and the bias/coupling circuit being on the same die (e.g., example configuration of FIG. 23A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and a bias/coupling circuit 150 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 24B:
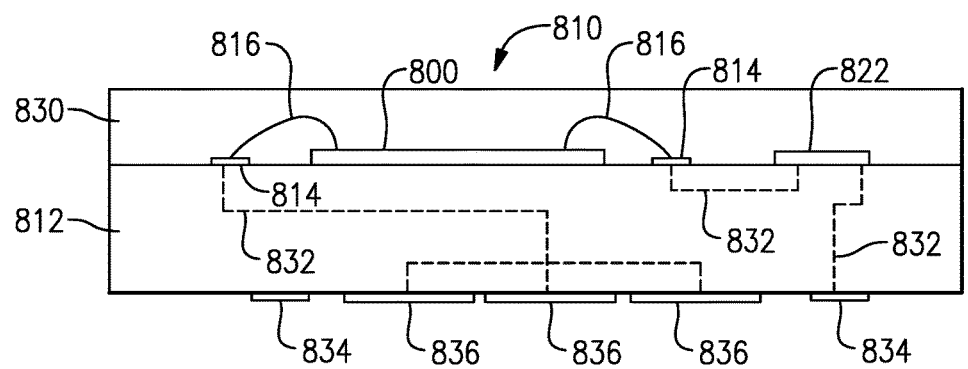
Figure 25:
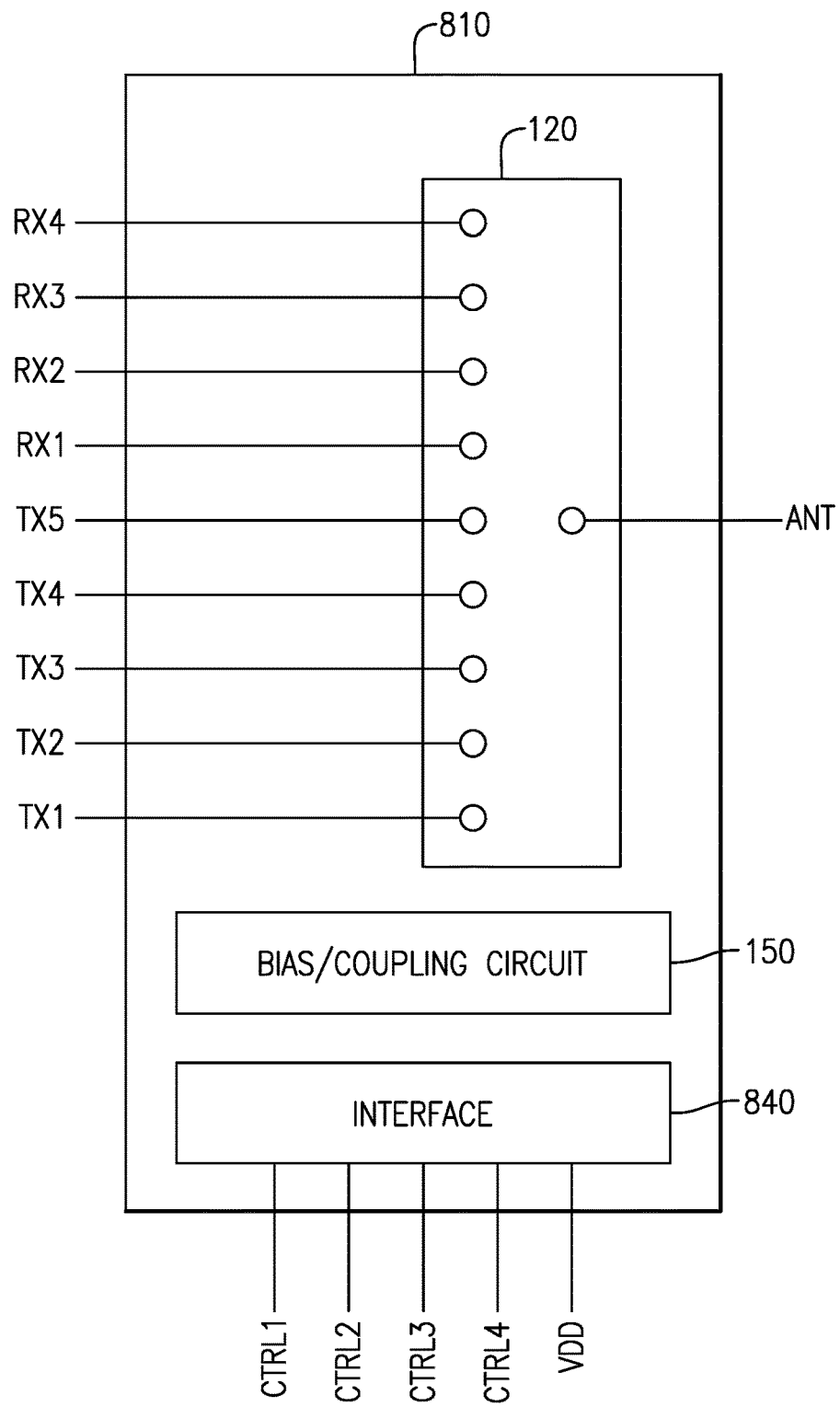
FIG. 25 illustrates a schematic diagram of an example switching configuration that can be implemented in the module of FIGS. 24A and 24B.

FIG. 25 shows a schematic diagram of an example switching configuration that can be implemented in the module 810 described in reference to FIGS. 24A and 24B. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the bias/coupling circuit 150. In some implementations, supply voltage and control signals can be applied to the switch circuit 120 via the bias/coupling circuit 150.

Figure 26:
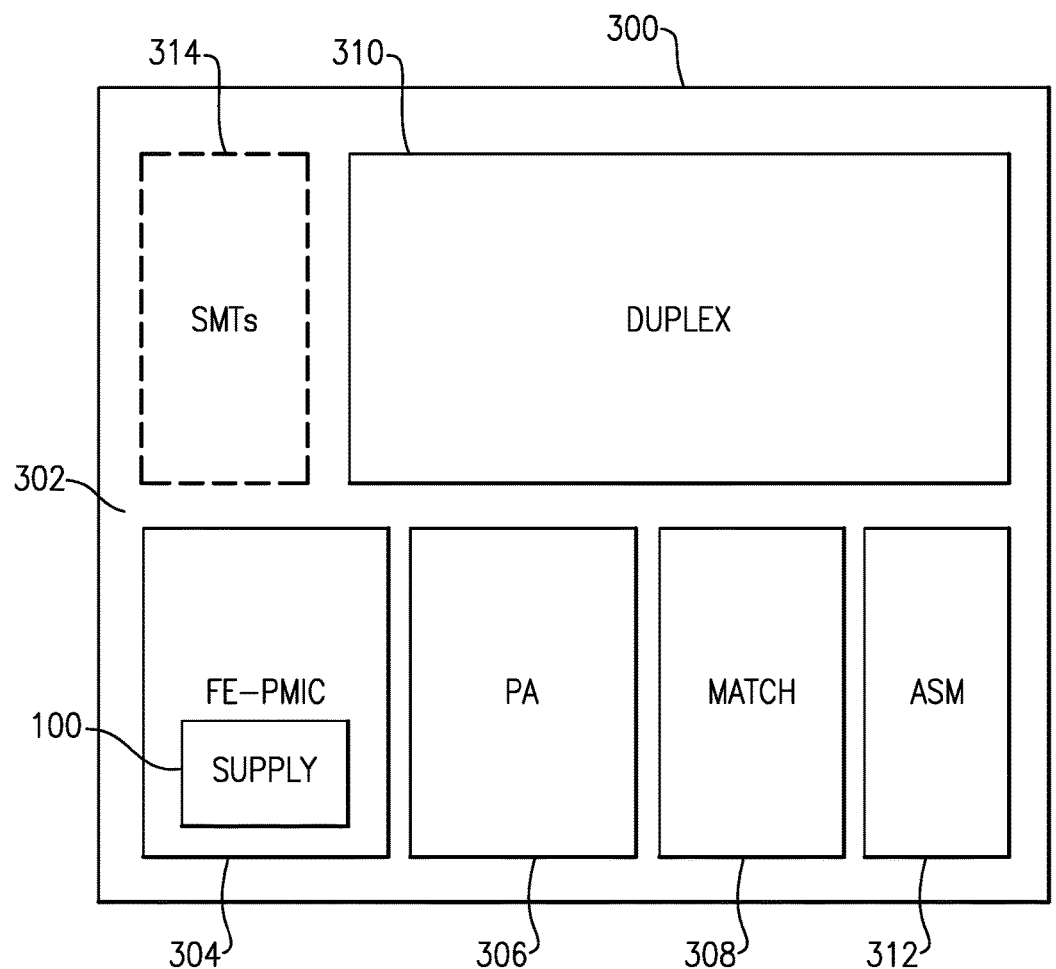
FIG. 26 illustrates that in some embodiments, some or all of the devices having one or more features as described herein may be implemented in a module.

FIG. 26 shows that in some embodiments, some or all of the devices having one or more features as described herein may be implemented in a module. Such a module may be, for example, a front-end module (FEM). In the example of FIG. 26, a radio frequency (RF) module 300 can include a packaging substrate 302, and a number of components may be mounted on such a packaging substrate. For example, a front-end power management integrated circuit (FE-PMIC) component 304, a power amplifier assembly 306, a match component 308, and a duplexer assembly 310 may be mounted and/or implemented on and/or within the packaging substrate 302. The FE-PMIC component 304 includes a supply 100 which may be a power supply (e.g., a battery, a voltage/power source) and/or may be coupled to a power supply. Other components such as a number of surface mount technology (SMT) devices 314 and an antenna switch module (ASM) 312 can also be mounted on the packaging substrate 302. Although all of the various components are depicted as being laid out on the packaging substrate 302, it will be understood that some component(s) may be implemented over other component(s). In some embodiments, the components of the RF module 300 and one or more serial buses/interfaces (e.g., a RFFE bus/interface) used by the components of the RF module 300 may implement and/or perform one or more features as described herein.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 27:
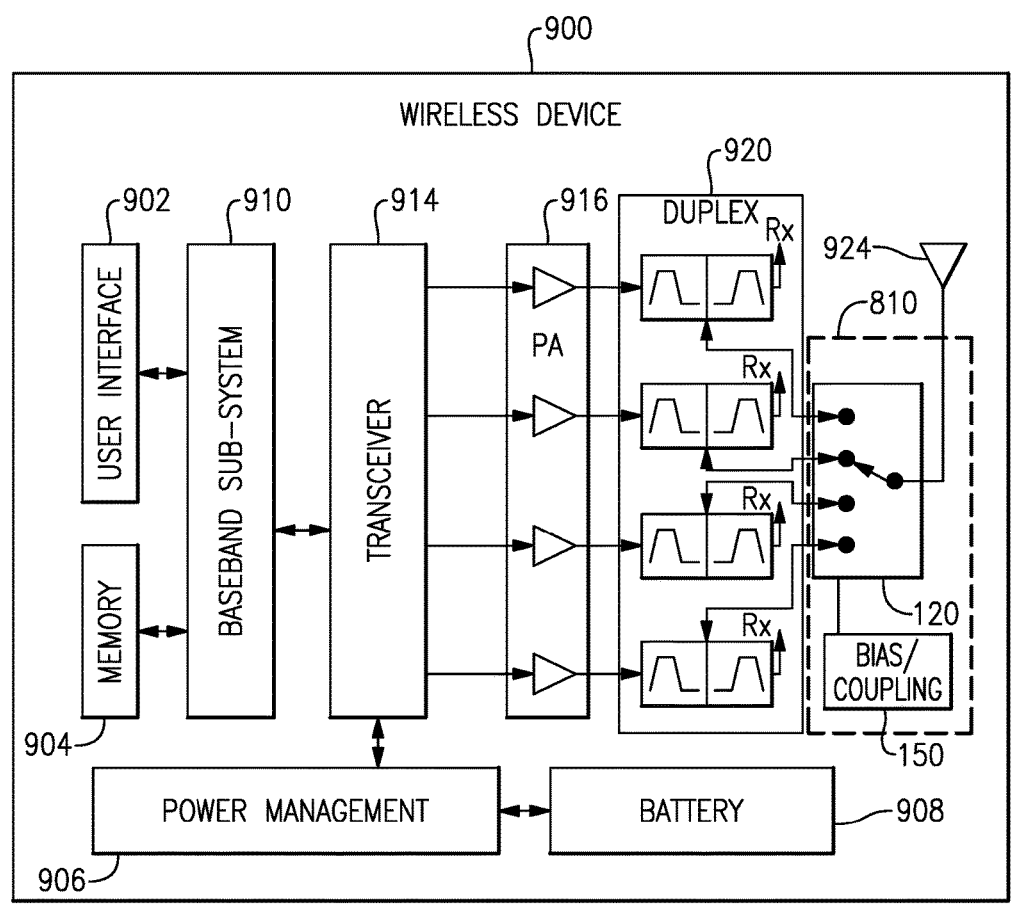
FIG. 27 illustrates an example wireless device having one or more advantageous features described herein.

FIG. 27 schematically depicts an example wireless device 900 having one or more advantageous features described herein. In the context of various switches and various biasing/coupling configurations as described herein, a switch 120 and a bias/coupling circuit 150 can be part of a module 810. In some embodiments, such a switch module can facilitate, for example, multi-band multi-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 27, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the disclosure is not intended to be exhaustive or to limit the disclosure to the precise form disclosed above. While specific embodiments of, and examples for, the disclosure are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the disclosure provided herein can be applied to other systems, not necessarily the system described above. The elements and acts of the various embodiments described above can be combined to provide further embodiments.

While certain embodiments of the disclosure have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency switch comprising:
   a switch arm having a set of field-effect transistors disposed between a first node and a second node, each field-effect transistor of the set of field-effect transistors having a respective source, drain, gate, and body;
   a distorter arm coupled in parallel to the switch arm, the distorter arm having a non-linear resistor or a field-effect transistor, the distorter arm configured to compensate a non-linearity effect generated by the set of field-effect transistors in the switch arm; and
   a second distorter arm coupled in parallel to the switch arm and to the distorter arm, the second distorter arm having a non-linear resistor or a field-effect transistor.

2. The radio-frequency switch of claim 1 wherein the one or more field-effect transistors of the distorter arm have a gate width that is smaller than about 10 μm and the set of field-effect transistors of the switch arm have a gate width that is larger than about 1 mm.

3. The radio-frequency switch of claim 1 wherein the set of field-effect transistors of the switch arm includes at least 12 field-effect transistors.

4. The radio-frequency switch of claim 1 further comprising a voltage buffer coupled in series with the distorter arm and in parallel with the switch arm, the voltage buffer including a set of field-effect transistors.

5. The radio-frequency switch of claim 4 wherein the set of field-effect transistors of the voltage buffer each have a gate width that is larger than a gate width of the field-effect transistor of the distorter arm and smaller than a gate width of each field-effect transistor in the switch arm.

6. The radio-frequency switch of claim 4 wherein, in an ON state of the radio-frequency switch, the voltage buffer, the switch arm, and the distorter arm are configured to be in an ON state.

7. The radio-frequency switch of claim 6 wherein, in an OFF state of the radio-frequency switch, the voltage buffer and the switch arm are configured to be in an OFF state and the distorter arm is configured to be in an ON state.

8. The radio-frequency switch of claim 1 further comprising a voltage supply configured to provide a first drain-source voltage on the field-effect transistor of the distorter arm and to provide a second drain-source voltage on the field-effect transistor of the second distorter arm, wherein the first drain-source voltage and the second drain-source voltage have the same magnitude and opposite polarity.

9. The radio-frequency switch of claim 1 further comprising a first DC-blocking capacitor having a first end coupled to a junction between the first node and the switch arm and a second end coupled to the distorter arm and a second DC-blocking capacitor having a first end coupled to a junction between the second node and the switch arm and a second end coupled to the distorter arm.

10. The radio-frequency switch of claim 1 wherein the distorter arm and the second distorter arm are each configured to compensate the non-linearity effect by generating third-order intermodulation distortion and the distorter arm and the second distorter arm do not increase second-order harmonic distortion of the radio-frequency switch.

11. The radio frequency switch of claim 1 further comprising a biasing circuit having at least two current sources to drive currents to the distorter arm and to the second distorter arm.

12. The radio frequency switch of claim 11 wherein the at least two current sources generate a current loop in the biasing circuit, the current loop being formed with the distorter arm, the second distorter arm, and the at least two current sources.

13. The radio frequency switch of claim 12, wherein, due at least in part to high impedance of the at least two current sources, the biasing circuit reduces RF choke between a DC bias source and the distorter arm and the second distorter arm.

14. The radio-frequency switch of claim 1 wherein the distorter arm is configured to generate third-order intermodulation distortion to reduce the non-linearity effect generated by the set of field-effect transistors in the switch arm.

15. The radio-frequency switch of claim 1 wherein the set of field-effect transistors comprise silicon-on-insulator (SOI) set of field-effect transistors.

16. A radio-frequency switch module comprising:
a packaging substrate configured to receive a plurality of components;
a semiconductor die mounted on the packaging substrate, the semiconductor die including a set of field-effect transistors in a switch arm; and
a distorter arm mounted on the packaging substrate coupled in parallel with the set of field-effect transistors of the switch arm, the distorter arm having one or more field-effect transistors that are configured to compensate a non-linearity effect generated by the set of field-effect transistors of the switch arm; and
a second distorter arm mounted on the packaging substrate coupled in parallel with the set of field-effect transistors and with the distorter arm, the second distorter arm having a non-linear resistor or a field-effect transistor.

17. The radio-frequency switch module of claim 16 further comprising a voltage buffer mounted on the packaging substrate, the voltage buffer coupled in series with the distorter arm and combination of the distorter arm and the voltage buffer coupled in parallel with the switch arm.

18. A wireless device comprising:
a transceiver configured to process radio-frequency (RF) signals;
an antenna in communication with the transceiver configured to facilitate transmission of an amplified RF signal;
a power amplifier connected to the transceiver and configured to generate the amplified RF signal; and
a switch connected to the antenna and the power amplifier and configured to selectively route the amplified RF signal to the antenna, the switch including a set of field-effect transistors in a switch arm, the switch also including a distorter arm coupled in parallel with the set of field-effect transistors of the switch arm, the distorter arm having one or more field-effect transistors that are configured to compensate a non-linearity effect generated by the set of field-effect transistors of the switch arm, and the switch also including a second distorter arm coupled in parallel with the set of field-effect transistors and with the distorter arm, the second distorter arm having a non-linear resistor or a field-effect transistor.

19. The wireless device of claim 18 wherein the combination of the distorter arm and the second distorter arm is configured to compensate a non-linearity effect generated by the set of field-effect transistors of the switch arm.

\* \* \* \* \*